(12) United States Patent
Millward et al.

(10) Patent No.: US 9,315,609 B2
(45) Date of Patent: *Apr. 19, 2016

(54) THERMAL ANNEAL OF BLOCK COPOLYMER FILMS WITH TOP INTERFACE CONSTRAINED TO WET BOTH BLOCKS WITH EQUAL PREFERENCE

(71) Applicant: Micron Technology, Inc., Boise, ID (US)

(72) Inventors: Dan B. Millward, Boise, ID (US); Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/104,304

(22) Filed: Dec. 12, 2013

(65) Prior Publication Data

US 2014/0107296 A1    Apr. 17, 2014

Related U.S. Application Data

(60) Division of application No. 13/469,697, filed on May 11, 2012, now Pat. No. 8,633,112, which is a continuation of application No. 12/052,956, filed on Mar. 21, 2008, now Pat. No. 8,426,313.

(51) Int. Cl.
| | |
|---|---|
| C08F 299/02 | (2006.01) |
| C08F 299/04 | (2006.01) |
| H01L 21/311 | (2006.01) |
| B81C 1/00 | (2006.01) |
| B82Y 30/00 | (2011.01) |
| H01L 21/033 | (2006.01) |
| G03F 7/00 | (2006.01) |

(52) U.S. Cl.
CPC ....... *C08F 299/0492* (2013.01); *B81C 1/00031* (2013.01); *B82Y 30/00* (2013.01); *C08F 299/02* (2013.01); *G03F 7/0002* (2013.01); *H01L 21/0337* (2013.01); *H01L 21/0338* (2013.01); *B81C 2201/0149* (2013.01); *B81C 2201/0198* (2013.01)

(58) Field of Classification Search
CPC ............. B81C 1/00031; B81C 2201/0149; B81C 2201/0198; B82Y 30/00; C08F 299/02; C08F 299/0492; H01L 21/0337; H01L 21/0338

See application file for complete search history.

(56) References Cited

U.S. PATENT DOCUMENTS

| | | | |
|---|---|---|---|
| 4,623,674 A | 11/1986 | Bailey, Jr. | |
| 4,797,357 A | 1/1989 | Mura et al. | |
| 4,818,713 A | 4/1989 | Feygenson | |
| 4,877,647 A | 10/1989 | Klabunde | |
| 5,328,810 A | 7/1994 | Lowrey et al. | |
| 5,374,367 A | 12/1994 | Edamura et al. | |
| 5,382,373 A | 1/1995 | Carlson | |
| 5,482,656 A | 1/1996 | Hiraoka et al. | |
| 5,512,131 A | 4/1996 | Kumar et al. | |
| 5,538,655 A | 7/1996 | Fauteux et al. | |
| 5,580,700 A | 12/1996 | Rahman et al. | |
| 5,620,850 A | 4/1997 | Bamdad et al. | |
| 5,622,668 A | 4/1997 | Thomas et al. | |
| 5,772,905 A | 6/1998 | Chou | |
| 5,834,583 A | 11/1998 | Hancock et al. | |
| 5,849,810 A | 12/1998 | Mueller | |
| 5,879,582 A | 3/1999 | Havelka et al. | |
| 5,879,853 A | 3/1999 | Azuma | |
| 5,891,356 A | 4/1999 | Inoue et al. | |
| 5,904,824 A | 5/1999 | Oh et al. | |
| 5,925,259 A | 7/1999 | Biebuyck et al. | |
| 5,948,470 A | 9/1999 | Harrison et al. | |
| 5,958,704 A | 9/1999 | Starzl et al. | |
| 6,051,869 A | 4/2000 | Pan et al. | |
| 6,111,323 A | 8/2000 | Carter et al. | |
| 6,143,647 A | 11/2000 | Pan et al. | |
| 6,153,495 A | 11/2000 | Kub et al. | |
| 6,207,787 B1 | 3/2001 | Fahey et al. | |
| 6,251,791 B1 | 6/2001 | Tsai et al. | |
| 6,270,946 B1 | 8/2001 | Miller | |
| 6,309,580 B1 | 10/2001 | Chou | |
| 6,310,138 B1 | 10/2001 | Yonezawa et al. | |
| 6,312,971 B1 | 11/2001 | Amundson et al. | |
| 6,368,871 B1 | 4/2002 | Christel et al. | |
| 6,403,382 B1 | 6/2002 | Zhu et al. | |
| 6,414,164 B1 | 7/2002 | Afzali-Ardakani et al. | |
| 6,423,465 B1 | 7/2002 | Hawker et al. | |
| 6,423,474 B1 | 7/2002 | Holscher | |
| 6,503,841 B1 | 1/2003 | Criscuolo et al. | |
| 6,506,660 B2 | 1/2003 | Holmes et al. | |

(Continued)

FOREIGN PATENT DOCUMENTS

| | | |
|---|---|---|
| CN | 1562730 A | 1/2005 |
| CN | 1799131 A | 7/2006 |

(Continued)

OTHER PUBLICATIONS

Ali et al., Properties of Self-assembled ZnO Nanostructures, Solid-State Electronics 46 (2002), 1639-1642.

Arshady et al., The Introduction of Chloromethyl Groups into Styrene-based Polymers, 1, Makromol. Chem., vol. 177, 1976, p. 2911-2918.

Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, (Dec. 1, 2005), pp. 7475-7482.

(Continued)

Primary Examiner — Irina S Zemel
Assistant Examiner — Jeffrey Lenihan
(74) Attorney, Agent, or Firm — TraskBritt

(57) ABSTRACT

Methods for fabricating sub-lithographic, nanoscale microstructures utilizing self-assembling block copolymers, and films and devices formed from these methods are provided.

21 Claims, 17 Drawing Sheets

(56) References Cited

U.S. PATENT DOCUMENTS

| | | |
|---|---|---|
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,723,009 B2 | 5/2010 | Sandhu et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,114,306 B2 | 2/2012 | Cheng et al. |
| 8,206,601 B2 | 6/2012 | Bosworth et al. |
| 8,287,749 B2 | 10/2012 | Hasegawa et al. |
| 8,294,139 B2 | 10/2012 | Marsh et al. |
| 8,372,295 B2 | 2/2013 | Millward |
| 8,394,483 B2 | 3/2013 | Millward |
| 8,404,124 B2 | 3/2013 | Millward et al. |
| 8,409,449 B2 | 4/2013 | Millward et al. |
| 8,425,982 B2 | 4/2013 | Regner |
| 8,426,313 B2 | 4/2013 | Millward et al. |
| 8,445,592 B2 | 5/2013 | Millward |
| 8,512,846 B2 | 8/2013 | Millward |
| 8,513,359 B2 | 8/2013 | Millward |
| 8,518,275 B2 | 8/2013 | Millward et al. |
| 8,551,808 B2 | 10/2013 | Marsh et al. |
| 8,557,128 B2 | 10/2013 | Millward |
| 8,808,557 B1 | 8/2014 | Seino et al. |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0158432 A1 | 10/2002 | Wain |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |

(56) References Cited

U.S. PATENT DOCUMENTS

| | | |
|---|---|---|
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0196748 A1 | 10/2003 | Hougham et al. |
| 2003/0218644 A1 | 11/2003 | Higuchi et al. |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0076757 A1 | 4/2004 | Jacobson et al. |
| 2004/0084298 A1 | 5/2004 | Yao et al. |
| 2004/0109263 A1 | 6/2004 | Suda et al. |
| 2004/0124092 A1 | 7/2004 | Black |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze |
| 2005/0159293 A1 | 7/2005 | Wan et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0046484 A1 | 3/2006 | Abatchev et al. |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038467 A1 | 2/2008 | Jagannathan et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0078982 A1 | 4/2008 | Min et al. |
| 2008/0078999 A1 | 4/2008 | Lai |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0241218 A1 | 10/2008 | McMorrow et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0087664 A1 | 4/2009 | Nealey et al. |
| 2009/0155579 A1 | 6/2009 | Greco et al. |
| 2009/0196488 A1 | 8/2009 | Nealey et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |

(56) References Cited

U.S. PATENT DOCUMENTS

| | | |
|---|---|---|
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0028471 A1 | 2/2012 | Oyama et al. |
| 2012/0122292 A1 | 5/2012 | Sandhu et al. |
| 2012/0133017 A1 | 5/2012 | Millward et al. |
| 2012/0135146 A1 | 5/2012 | Cheng et al. |
| 2012/0135159 A1 | 5/2012 | Xiao et al. |
| 2012/0138570 A1 | 6/2012 | Millward et al. |
| 2012/0164389 A1 | 6/2012 | Yang et al. |
| 2012/0202017 A1 | 8/2012 | Nealy et al. |
| 2012/0211871 A1 | 8/2012 | Russell et al. |
| 2012/0223053 A1 | 9/2012 | Millward et al. |
| 2012/0225243 A1 | 9/2012 | Millward |
| 2013/0295323 A1 | 11/2013 | Millward |
| 2013/0330668 A1 | 12/2013 | Wu et al. |
| 2013/0330688 A1 | 12/2013 | Hedrick et al. |
| 2014/0060736 A1 | 3/2014 | Millward et al. |
| 2014/0127626 A1 | 5/2014 | Senzaki et al. |
| 2014/0272723 A1 | 9/2014 | Somervell et al. |
| 2015/0021293 A1 | 1/2015 | Morris et al. |

FOREIGN PATENT DOCUMENTS

| | | | |
|---|---|---|---|
| CN | 101013662 A | | 8/2007 |
| EP | 784543 B1 | | 4/2000 |
| EP | 1416303 A2 | | 5/2004 |
| EP | 1906237 A2 | | 4/2008 |
| EP | 1593164 B1 | | 6/2010 |
| JP | 11080414 A | | 3/1999 |
| JP | 2003155365 A | | 5/2003 |
| JP | 2004335962 A | | 11/2004 |
| JP | 2005008882 A | | 1/2005 |
| JP | 2005029779 A | | 2/2005 |
| JP | 2006036923 A | | 2/2006 |
| JP | 2006055982 A | | 3/2006 |
| JP | 2006110434 A | | 4/2006 |
| JP | 2007194175 A | | 8/2007 |
| JP | 2008036491 A | | 2/2008 |
| JP | 2008043873 A | | 2/2008 |
| KR | 20060128378 A | | 12/2006 |
| KR | 20070029762 A | | 3/2007 |
| KR | 100771886 B1 | | 11/2007 |
| TW | 200400990 | | 3/1992 |
| TW | 200633925 | | 10/1994 |
| TW | 200740602 | | 1/1996 |
| TW | 200802421 | | 2/1996 |
| TW | 584670 B | | 4/2004 |
| TW | 200419017 | | 10/2004 |
| TW | 200511364 | | 3/2005 |
| TW | I256110 B | | 6/2006 |
| TW | I253456 | | 11/2007 |
| WO | 9007575 | | 7/1990 |
| WO | 9706013 A1 | | 2/1997 |
| WO | 9839645 A1 | | 9/1998 |
| WO | 9947570 A1 | | 9/1999 |
| WO | 0031183 A1 | | 6/2000 |
| WO | 0218080 A1 | | 3/2002 |
| WO | 02081372 A2 | | 10/2002 |
| WO | 03045840 A2 | | 6/2003 |
| WO | 2005122285 A2 | | 12/2005 |
| WO | 2006003592 A2 | | 1/2006 |
| WO | 2006003594 A2 | | 1/2006 |
| WO | 2006076016 A2 | | 7/2006 |
| WO | 2006078952 A1 | | 7/2006 |
| WO | 2006112887 A2 | | 10/2006 |
| WO | 2007001294 A1 | | 1/2007 |
| WO | 2007013889 A2 | | 2/2007 |
| WO | 2007024241 A2 | | 3/2007 |
| WO | 2007024323 A2 | | 3/2007 |
| WO | 2007019439 A3 | | 5/2007 |
| WO | 2007055041 A1 | | 5/2007 |
| WO | 2008055137 A2 | | 5/2008 |
| WO | 2008091741 A2 | | 7/2008 |
| WO | 2008096335 A2 | | 8/2008 |
| WO | 2008097736 A2 | | 8/2008 |
| WO | 2008118635 A2 | | 10/2008 |
| WO | 2008124219 A2 | | 10/2008 |
| WO | 2008130847 A1 | | 10/2008 |
| WO | 2008145268 A1 | | 12/2008 |
| WO | 2008156977 A2 | | 12/2008 |
| WO | 2009099924 A2 | | 8/2009 |
| WO | 2009102551 A2 | | 8/2009 |
| WO | 2009117238 A2 | | 9/2009 |
| WO | 2009117243 A1 | | 9/2009 |
| WO | 2009134635 A2 | | 11/2009 |

OTHER PUBLICATIONS

Bae, Joonwon, Surface Modification Using Photo-Crosslinkable Random Copolymers, Abstract submitted for the Mar. 2006 meeting of the American Physical Society, submitted Nov. 30, 2005. (Accessed via the Internet [retrieved on Apr. 5, 2010], URL: http://absimage.aps.org/image/MWS_MAR06-2005-003641.pdf).

Balsara et al., CPIMA, IRG Technical Programs, Synthesis and application of Nanostructured Materials, Leland Stanford Junior Univ., 2006, http://www.stanford.edu/group/cpima/irg/irg_1.htm.

Bang, J., The Effect of Humidity on the Ordering of Tri-block Copolymer Thin Films, Abstract submitted for the Mar. 2007 meeting of The American Physical Society, submitted Nov. 20, 2006.

Bass et al., Microcontact Printing with Octadecanethiol, Applied Surface Science, vol. 226, No. 4, (Apr. 2004), pp. 335-340.

Bearinger et al., Chemisorbed Poly(propylene sulphide)-based Copolymers Resist Biomolecular Interactions, Nature Materials 2, (2003), pp. 259-264.

Berry et al., Effects of Zone Annealing on Thin Films of Block Copolymers, National Institute of Standard and Technology, Polymers Division, Maryland, USA, (2007), 2 pages.

Berry et al., Orientational Order in Block Copolymer Films Zone Annealed Below the Order—Disorder Transition Temperature, Nano Letters vol. 7, No. (Aug. 2007), pp. 2789-2794.

Black et al., High-Capacity, Self-Assembled Metal-Oxide-Semiconductor Decoupling Capacitors, IEEE Electron Device Letters, vol. 25, No. 9, (Sep. 2004), pp. 622-624.

Black et al., Integration of Self Assembly for Semiconductor Microelectronics, IEEE 2005 Custom Integrated Circuits Conference, IBM T.J. Watson Research Center, (2005), pp. 87-91.

Black et al., Integration of Self-Assembled Diblock Copolymers for Semiconductor Capacitor Fabrication, Applied Physics Letters, vol. 79, No. 3, (2001), pp. 409-411.

Black et al., Nanometer-Scale Pattern Registration and Alignment by Directed Diblock Copolymer Self-Assembly, IEEE Transactions on Nanotechnology, vol. 3, No. 3, (Sep. 2004), pp. 412-415.

Black et al., Polymer Self Assembly in Semiconductor Microelectronics, IBM J. Res. & Dev. vol. 51, No. 5, (Sep. 2007), pp. 605-633.

Black et al., Self Assembly in Semiconductor Microelectronics: Self-Aligned Sub-Lithographic Patterning Using Diblock Copolymer Thin Films, Proc. of SPIE, vol. 6153, 615302 (2006).

Black, C. T., Polymer Self-Assembly as a Novel Extension to Optical Lithography, American Chemical Society, ACSNano, vol. 1, No. 3, (2007), pp. 147-150.

Black, C. T., Self-aligned self-assembly of multi-nanowire silicon field effect transistors, Appl. Phys. Lett., vol. 87, (2005), pp. 163116-1 through 163116-3.

Botelho et al., Diblock Copolymer Ultrathin Films Studied by High Resolution Electron Energy Loss Spectroscopy, Surface Science, 482-485 (2001), pp. 1228-1234.

(56) References Cited

OTHER PUBLICATIONS

Brydson et al. (chapter authors), Generic Methodologies for Nanotechnology: Classification and Fabrication, Nanoscale Science and Technology, John Wiley & Sons, Ltd., (Dec. 20, 2005), pp. 1-55.
Bulpitt et al., New Strategy for Chemical Modification of Hyaluronic Acid: Preparation of Functionalized Derivatives and Their Use in the Formation of Novel Biocompatible Hydrogels, Journal of Biomedical Materials Research, vol. 47, Issue 2, (Aug. 1999) pp. 152-169, Abstract only.
Canaria et al., Formation and Removal of Alkylthiolate Self-Assembled Monolayers on Gold in Aqueous Solutions, Lab Chip 6, (2006). pp. 289-295. Abstract only.
Candau et al, Synthesis and Characterization of Polystyrene-poly-(ethylene oxide) Graft Copolymers, Polymer, vol. 18, (1977), pp. 1253-1257.
Cavicchi et al., Solvent Annealed Thin Films of Asymmetric Polyisoprene—Polylactide Diblock Copolymers, Macromolecules 2007, vol. 40, (2007), pp. 1181-1186.
Cha et al., Biomimetic Approaches for Fabricating High-Density Nanopatterned Arrays, Chem. Mater. vol. 19, (2007), pp. 839-843.
Chai et al., Assembly of Aligned Linear Metallic Patterns on Silicon, Nature Nanotechnology, vol. 2, (Aug. 2007), pp. 500-506.
Chai et al., Using Cylindrical Domains of Block Copolymers to Self-Assemble and Align Metallic Nanowires, American Chemical Society, www.acsnano.org, (2008), pp. A-M.
Chandekar et al., Template-Directed Adsorption of block Copolymers on Alkanethiol-Patterned Gold Surfaces, (circa 2006), http://www.nano.neu.edu/industry/industry_showcase/industry_day/documents/Chandekar.pdf) (Powerpoint template for scientific posters (Swarthmore College)), 1 page.
Chang, Li-Wen, Diblock Copolymer Directed Self-Assembly for CMOS Device Fabrication, Proc. Of SPIE, vol. 6156, ( 2006), 615611-1 to 615611-6.
Chang, Li-Wen, Experimental Demonstration of Aperiodic Patterns of Directed Self-Assembly of Block Copolymer Lithography for Random Logic Circuit Layout, IEEE International Electron Devices Meeting (IEDM), paper 33.2, (Dec. 6-8, 2010), pp. 33.2.1-33.2.4.
Chen et al., Highly Ordered Arrays of Mesoporous Silica Nanorods with Tunable Aspect Ratios from Block Copolymer Thin Films, Advanced Materials, vol. 20, (2008), pp. 763-767.
Cheng et al., Rapid Directed Self Assembly of Lamellar Microdomains from a Block Copolymer Containing Hybrid, Applied Physics Letters, vol. 91, (2007), pp. 143106-143106-3.
Cheng et al., Self-Assembled One-Dimensional Nanostructure Arrays, Nano Letters, vol. 6, No. 9, (2006), pp. 2099-2103.
Cheng et al., Templated Self-Assembly of Block Copolymers: Effect of Substrate Topography, Adv. Mater., vol. 15, No. 19, (2003), pp. 1599-1602.
Cho et al., Nanoporous Block Copolymer Micelle/Micelle Multilayer Films with Dual Optical Properties, J. Am. Chem. Soc., vol. 128, No. 30, (2006), pp. 9935-9942.
Choi et al., Magnetorheology of Synthesized Core—Shell Structured Nanoparticle, IEEE Transactions on Magnetics, vol. 41, No. 10, (Oct. 2005), pp. 3448-3450.
Clark et al., Selective Deposition in Multilayer Assembly: SAMs as Molecular Templates, Supramolecular Science, vol. 4, (1997), pp. 141-146.
Daoulas et al., Fabrication of Complex Three-Dimensional Nanostructures from Self-Assembling Block Copolymer Materials on Two-Dimensional Chemically Patterned Templates with Mismatched Symmetry, Physical Review Letters 96, week ending Jan. 27, 2006, pp. 036104-1-3.
Darling, Directing the Self-assembly of Block Copolymers, Progress in Polymer Science, vol. 32, No. 10, (Sep. 28, 2007), pp. 1152-1204.
Desai et al., Engineered Silicon Surfaces for Biomimetic Interfaces, Business Briefing: Medical Device Manufacturing & Technology, (2002), pp. 1-4.
Edwards et al., Mechanism and Kinetics of Ordering in Diblock Copolymer Thin Films on Chemically Nanopatterned Substrates, Journal of Polymer Science: Part B Polymer Physics, vol. 43, (2005), pp. 3444-3459.
Edwards et al., Precise Control over Molecular Dimensions of Block-Copolymer Domains Using the Interfacial Energy of Chemically Nanopatterned Substrates, Advanced Mater., 16, No. 15, (Aug. 4, 2004), pp. 1315-1319.
Electronegativity—<http://www.princeton.edu/~achaney/tmve/wiki100k/docs/Electronegativity.html> website, visited Aug. 28, 2013, 1 page.
Elisseeff et al., Photoencapsulation of Chondrocytes in Poly(ethylene oxide)-based Semi-interpenetrating Networks, Journal of Biomedical Materials Research, vol. 51, No. 2, (Aug. 2000), pp. 164-171, Abstract only.
Erlandsson et al., Metallic Zinc Reduction of Disulfide Bonds Between Cysteine Residues in Peptides and Proteins, Int'l J. Peptide Res. & Therapeutics, vol. 11, No. 4, (Dec. 2005), pp. 261-265.
Fasolka et al., Block Copolymer Thin Films: Physics and Applications, Annual Reviews Materials Res., vol. 31, (Aug. 2001), pp. 323-355.
Fasolka et al., Morphology of Ultrathin Supported Diblock Copolymer Films: Theory and Experiment, Macromolecules 2000, vol. 33, No. 15, (2000), pp. 5702-5712.
Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, (Dec. 31, 2003), pp. 352-353.
Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, (Aug. 2006), pp. 6171-6179.
Gates et al., Unconventional Nanofabrication, Annu. Rev. Mater. Res., vol. 34, (2004), pp. 339-372.
Krishnamoorthy et al., Block Copolymer Micelles as Switchable Templates for Nanofabrication, Languir, vol. 22, No. 8, (2006), pp. 3450-3452.
Krishnamoorthy et al., Nanopatterned Self-Assembled Monolayers by Using Diblock Copolymer Micelles as Nanometer-Scale Adsorption and Etch Masks, Advanced Materials, (2008), pp. 1-4.
Krishnamoorthy et al., Nanoscale Patterning with Block Copolymers, Materials Today, vol. 9, No. 9, (Sep. 2006), pp. 40-47.
Kuhnline et al., Detecting Thiols in a Microchip Device Using Micromolded Carbon Ink Electrodes Modified with Cobalt Phthalocyanine, Analyst, vol. 131, (2006), pp. 202-207.
La et al., Directed Assembly of Cylinder-Forming Block Copolymers into Patterned Structures to Fabricate Arrays of Spherical Domains and Nanoparticles, Chem. Mater., vol. 19, No. 18, (2007), pp. 4538-4544.
La et al., Pixelated Chemically Amplified Resists: Investigation of Material Structure on the Spatial Distribution of Photoacids and Line Edge Roughness, J. Vac. Sci. Technol. vol. B 25, No. 6, (Nov./Dec. 2007), pp. 2508-2513.
Laracuente et al., Step Structure and Surface Morphology of Hydrogen-terminated Silicon: (001) to (114), Surface Science 545, (2003), pp. 70-84.
Lentz et al., Whole Wafer Imprint Patterning Using Step and Flash Imprint Lithography: A Manufacturing Solution for Sub 100 nm Patterning, SPIE Advanced Lithography Paper, Molecular Imprints, Inc., Texas, USA, (Feb. 2007), pp. 1-10.
Li et al., A Method for Patterning Multiple Types of Cells by Using Electrochemical Desorption of Self-Assembled Monolayers within Microfluidic Channels, Angew. Chem. Int. Ed., vol. 46, (2007), pp. 1094-1096.
Li et al., Block Copolymer Patterns and Templates, Materials Today, vol. 9, No. 9, (Sep. 2006), pp. 30-39.
Li et al., Creation of Sub-20-nm Contact Using Diblock Copolymer on a 300 mm Wafer for Complementary Metal Oxide Semiconductor Applications, J. Vac. Sci. Technol., vol. B 25, No. 6, (Nov./Dec. 2007), pp. 1982-1984.
Li et al., Morphology Change of Asymmetric Diblock Copolymer Micellar Films During Solvent Annealing, ScienceDirect, Polymer 48, (2007), pp. 2434-2443.

(56) References Cited

OTHER PUBLICATIONS

Lin et al., A Rapid Route to Arrays of Nanostructures in Thin Films, Adv. Mater. 2002, vol. 14, No. 19, (Oct. 2, 2002), pp. 1373-1376.
Lin-Gibson et al., Structure—Property Relationships of Photopolymerizable Poly(ethylene glycol) Dimethacrylate Hydrogels, Macromolecules 2005, 38, American Chemical Society, (2005), pp. 2897-2902.
Liu et al., Pattern Transfer Using Poly(styrene-block-methyl methacrylate) Copolymer Films and Reactive Ion Etching, J. Vac. Sci. Technol. B, vol. 25, No. 6, (Nov./Dec. 2007), pp. 1963-1968.
Loo et al., Additive, Nanoscale Patterning of Metal Films with a Stamp and a Surface Chemistry Mediated Transfer Process: Applications in Plastic Electronics, Applied Physics Letters, vol. 81, No. 3, (Jul. 15, 2002), pp. 562-564.
Lopes et al., Hierarchical Self-Assembly of Metal Nanostructures on Diblock Copolymer Scaffolds, Nature, vol. 414, (Dec. 13, 2001), pp. 735-738.
Lutolf et al., Cell-Responsive Synthetic Hydrogels, Adv. Mater., vol. 15, No. 11, (Jun. 2003), pp. 888-892.
Lutolf et al., Synthetic Biomaterials as Instructive Extracellular Microenvironments for Morphogenesis in Tissue Engineering, Nature Biotechnology, vol. 23, (2005), pp. 47-55, abstract only.
Lutz, 1,3-Dipolar Cycloadditions of Azides and Alkynes: A Universal Ligation Tool in Polymer and Materials Science, Angew. Chem. Int. Ed., vol. 46, (2007), pp. 1018-1025.
Malenfant et al., Self-Assembly of an Organic-Inorganic Block Copolymer for Nano-Ordered Ceramics, Nature Nanotechnology, vol. 2, (Jan. 2007), pp. 43-46.
Malkoch et al., Synthesis of Well-defined Hydrogel Networks Using Click Chemistry, Chem. Commun., The Royal Society of Chemistry, (2006), pp. 2774-2776.
Mansky et al., Controlling Polymer-Surface Interactions with Random Copolymer Brushes, Science, vol. 275, (Mar. 7, 1997), pp. 1458-1460.
Martens et al., Characterization of Hydrogels Formed from Acrylate Modified Poly(vinyl alcohol) Macromers, Polymer, vol. 41, Issue 21, (Oct. 2000), pp. 7715-7722, abstract only.
Matsuda et al., Photoinduced Prevention of Tissue Adhesion, ASAIO J, vol. 38, No. 3, (Jul.-Sep. 1992), pp. M154-7, abstract only.
Maye et al., Chemical Analysis Using Force Microscopy, Journal of Chemical Education, vol. 79, No. 2, (Feb. 2002), pp. 207-210.
Melde et al., Silica Nanostructures Templated by Oriented Block Copolymer Thin Films Using Pore-Filling and Selective-Mineralization Routes, Chem. Mater., vol. 17, No. 18, (Aug. 13, 2005), pp. 4743-4749.
Metters et al., Network Formation and Degradation Behavior of Hydrogels Formed by Michael-Type Addition Reactions, Biomacromolecules 2005, vol. 6, (2005), pp. 290-301.
Meyer et al., Controlled Dewetting Processes on Microstructured Surfaces—a New Procedure for Thin Film Microstructuring, Macromollecular Mater. Eng., vol. 276/277, (2000), pp. 44-50.
Mezzenga et al., On the Role of Block Copolymers in Self-Assembly of Dense Colloidal Polymeric Systems, Langmuir 2003, vol. 19, No. 20, (2003), pp. 8144-8147.
Mindel et al., A Study of Bredig Platinum Sols, The Chemical Laboratories of New York University, vol. 65, (Jun. 10, 1943), pp. 2112.
Naito et al., 2.5-Inch Disk Patterned Media Prepared by an Artificially Assisted Self-Assembling Method, IEEE Transactions on Magnetics, vol. 38, No. 5, (Sep. 2002), pp. 1949-1951.
Nealey et al., Self-Assembling Resists for Nanolithography, IProceedings of the IEEE International Electron Devices Meeting, IEDM Technical Digest, (2005), pp. 356-359.
Nguyen, K. T., et al., Photopolymerizable Hydrogels for Tissue Engineering Applications, Biomaterials 23, (2002), pp. 4307-4314.
Nishikubo, T., Chemical Modification of Polymers via a Phase-Transfer Catalyst or Organic Strong Base, American Chemical Society Symposium Series, (1997), pp. 214-230.
Niu et al., Selective Assembly of Nanoparticles on Block Copolymer by Surface Modification, Nanotechnology, vol. 18, (2007), pp. 1-4.
Niu et al., Stability of Order in Solvent-Annealed Block Copolymer Thin Films, Macromolecules, vol. 36, No. 7, 2003, Univ. Of Nebraska, USA, pp. 2428-2440, (web release date: Mar. 13, 2003) (http://digitalcommons.uni.edu/cgi/viewcontent.cgi?article+1005 &contect=chemeng_nanotechnology).
Olayo-Valles et al. Large Area Nanolithographic Templates by Selective Etching of Chemically Stained Block Copolymer Thin Films, J. Mater. Chem., vol. 14, (2004), pp. 2729-2731.
Parejo et al., Highly Efficient UV-absorbing Thin-film Coatings for Protection of Organic Materials Against Photodegradation, J. Mater. Chem., vol. 16, (2006), pp. 2165-2169.
Park et al., Block Copolymer Lithography: Periodic Arrays of 1011 Holes in 1 Square Centimeter, Science, vol. 276, No. 5317, (May 30, 1997), pp. 1401-1404.
Park et al., Block Copolymer Multiple Patterning Integrated with Conventional ArF Lithography, Soft Matter, vol. 6, (2010), pp. 120-125.
Park et al., Controlled Ordering of Block Copolymer Thin Films by the Addition of Hydrophilic Nanoparticles, Macromolecules 2007, vol. 40, No. 22, (2007), pp. 8119-8124.
Park et al., Directed assembly of lamellae-forming block copolymers using chemically and topographically patterned substrates, Advanced Materials, vol. 19, No. 4, (Feb. 2007), pp. 607-611.
Park et al., Enabling Nanotechnology with Self Assembled Block Copolymer Patterns, Polymer 44, 2003, pp. 6725-6760.
Park et al., Fabrication of Highly Ordered Silicon Oxide Dots and Stripes from Block Copolymer Thin Films, Advanced Materials, vol. 20, (2008), pp. 681-685.
Park et al., High-Aspect-Ratio Cylindrical Nanopore Arrays and Their Use for Templating Titania Nanoposts, Advanced Materials, vol. 20, (2008), pp. 738-742.
Park et al., The Fabrication of Thin Films with Nanopores and Nanogrooves from Block Copolymer Thin Films on the Neutral Surface of Self-assembled Monolayers, Nanotechnology, vol. 18, (2007), pp. 1-7.
Peng, J., et al., Development of Nanodomain and Fractal Morphologies in Solvent Annealed Block copolymer Thin Films, Macromol. Rapid Commun., vol. 28, (2007), pp. 1422-1428.
Peters et al., Combining Advanced Lithographic Techniques and Self-assembly of Thin Films of Diblock Copolymers to Produce Templates for Nanofabrication, J. Vac. Sci. Technol. B, vol. 18, No. 6, (Nov./Dec. 2000), pp. 3530-3532.
Peters et al., Morphology of Thin Films of Diblock Copolymers on Surfaces Micropatterned with Regions of Different Interfacial Energy, Macromolecules, vol. 35, No. 5, (2002), pp. 1822-1834.
Gates, Nanofabrication with Molds & Stamps, Materials Today, (Feb. 2005), pp. 44-49.
Ge et al., Thermal Conductance of Hydrophilic and Hydrophobic Interfaces, The American Physical Society, PRL 96, (May 12, 2006), pp. 186101-1-186101-4.
Gelest Inc., Silane Coupling Agents: Connecting Across Boundaries, v2.0, (2006), pp. 1-56.
Genua et al., Functional Patterns Obtained by Nanoimprinting Lithography and Subsequent Growth of Polymer Brushes, Nanotechnology, vol. 18, (2007), pp. 1-7.
Gillmor et al., Hydrophilic/Hydrophobic Patterned Surfaces as Templates for DNA Arrays, Langmuir 2000, vol. 16, No. 18, (2000), pp. 7223-7228.
Grubbs, Hybrid Metal-Polymer Composites from Functional Block Copolymers, J. of Polymer Sci.: Part A: Polymer Chemistry, vol. 43, Issue 19, (Oct. 1, 2005), pp. 4323-4336.
Guarini et al., Nanoscale Patterning Using Self-Assembled Polymers for Semiconductor Applications, J. Vac. Sci. Technol. B 19(6), (Nov./Dec. 2001), pp. 2784-2788.
Gudipati et al., Hyperbranched Fluoropolymer and Linear Poly(ethylene glycol) Based Amphiphilic Crosslinked Networks as Efficient Antifouling Coatings: An Insight into the Surface Compositions, Topographies, and Morphologies, Journal of Polymer Science Part A: Polymer Chemistry, vol. 42, (2004), pp. 6193-6208.
Guo et al., Synthesis and Characterization of Novel Biodegradable Unsaturated Poly(ester amide)/Poly(ethylene glycol) Diacrylate Hydrogels, Abstract only, Journal of Polymer Science Part A: Polymer Chemistry, vol. 43, Issue 17, (2005), pp. 3932-3944.

(56) References Cited

OTHER PUBLICATIONS

Hadziioannou, Semiconducting Block Copolymers for Self-Assembled Photovoltaic Devices, MRS Bulletin, (Jun. 2002), pp. 456-460.
Hamers, Passivation and Activation: How Do Monovalent Atoms Modify the Reactivity of Silicon Surfaces? A Perspective on the Article, "The Mechanism of Amine Formation on Si(100) Activated with Chlorine Atoms," by C.C. Fustad, A.D. Thorsness, and A.J. Muscat, Surface Sci., vol. 600, (2006), pp. 3361-3362.
Hamley, I. W., Introduction to Block Copolymers, Developments in Block Copolymers Science and Technology, John Wiley & Sons, Ltd., (2004), pp. 1-29.
Hammond et al., Temperature Dependence of Order, Disorder, and Defects in Laterally Confined Diblock Copolymer Cylinder Monolayers, Macromolecules, American Chemical Society, vol. 38, (Jul. 2005), pp. 6575-6585.
Harrison et al., Layer by Layer Imaging of Diblock Copolymer Films with a Scanning Electron Microscope, Polymer, vol. 39, No. 13, (1998), pp. 2733-2744.
Hawker et al., Facile Synthesis of Block Copolymers for Nanolithographic Applications, Polymer Reprints, American Chemical Society, (2005), 2 pages.
Hawker et al., Improving the Manufacturability and Structural Control of Block Copolymer Lithography, Abstracts of Papers, 232nd ACS National Meeting, San Francisco, CA, (Sep. 10-14, 2006), 1 page, abstract only.
Hayward et al., Crosslinked Poly(styrene)-block-Poly(2-vinylpyridine) Thin Films as Swellable Templates for Mesostructured Silica and Titania, Advanced Materials, vol. 17, (2005), pp. 2591-2595.
He et al., Self-Assembly of Block Copolymer Micelles in an Ionic Liquid, J. Am. Chem. Soc., vol. 128, (2006), pp. 2745-2750.
Helmbold et al., Optical Absorption of Amorphous Hydrogenated Carbon Thin Films, Thin Solid Films, vol. 283, (1996), pp. 196-203.
Helmuth et al., High-Speed Microcontact Printing, J. Am. Chem. Soc., vol. 128, No. 29, (2006), pp. 9296-9297.
Hermans et al., Application of Solvent-Directed Assembly of Block Copolymers to the Synthesis of Nanostructured Materials with Low Dielectric Constants, Angewandte Chem. Int. Ed., vol. 45, Issue 40, (Oct. 13, 2006), pp. 6648-6652.
Horiuchi et al., Three-Dimensional Nanoscale Alignment of Metal Nanoparticles Using Block Copolymer Films as Nanoreactors, Langmuir, vol. 19, (2003), pp. 2963-2973.
Huang et al., Stretchable Gold Conductors on Elastomeric Substrates, Applied Physics Letters, vol. 82, No. 15, (Apr. 14, 2003), pp. 2404-2406.
Huang et al., Using Surface Active Random Copolymers to Control the Domain Orientation in Diblock Copolymer Thin Films, Macromolecules, vol. 31, (1998), pp. 7641-7650.
Hur et al., Nanotransfer Printing by Use of Noncovalent Surface Forces: Applications to Thin-Film Transistors That Use Single-Walled Carbon Nanotube Networks and Semiconducting Polymers, Applied Physics Letters, vol. 85, No. 23, (Dec. 6, 2004), pp. 5730-5732.
Hutchison et al., Polymerizable Living Free Radical Initiators as a Platform to Synthesize Functional Networks, Chem. Mater., vol. 17, No. 19, (2005), pp. 4789-4797.
Ikeda et al., Control of Orientation of Thin Films of Organic Semiconductors by Graphoepitaxy, NanotechJapan Bulletin—NIMS International Center for Nanotechnology Network., vol. 3, No. 3,(Dec. 17, 2010), pp. 1-23.
In et al., Side-Chain-Grafted Random Copolymer Brushes as Neutral Surfaces for Controlling the Orientation of Block Copolymer Microdomains in Thin Films, Langmuir, Department of Materials Science and Engineering and Chemical and Biological Engineering, Univ. of Wisconsin-Madison, vol. 22, No. 18, (2006), pp. 7855-7860.
International Search Report for International Application No. PCT/US2009/035861 dated Jun. 2, 2009, 4 pages.
International Written Opinion for International Application No. PCT/US2009/035861 dated Jun. 2, 2009, 6 pages.
International Preliminary Report on Patentability for Application No. PCT/US2009/035861 dated Sep. 21, 2010, 7 pages.
Ji et al., Generalization of the Use of Random Copolymers to Control the Wetting Behaviors of Block Copolymer Films, Macromolecules, vol. 41, No. 23, (2008), pp. 9098-9103.
Ji et al., Molecular Transfer Printing Using Block Copolymers, ACS Nano, vol. 4, No. 2, (2010), pp. 599-609.
Ji et al., Preparation of Neutral Wetting Brushes for Block Copolymer Films from Homopolymer Blends, submitted to Advanced Materials, vol. 20, No. 16, (Jul. 7, 2008), pp. 3054-3060.
Jiang et al., Electrochemical Desorption of Self-Assembled Monolayers Noninvasively Releases Patterned Cells from Geometrical Confinements, J. Am. Chem. Soc., vol. 125, No. 9, (2003), pp. 2366-2367.
Johnson et al., Probing the Stability of the Disulfide Radical Intermediate of Thioredoxin Using Direct Electrochemistry, Letters in Peptide Sci., vol. 10, (2003), pp. 495-500.
Jun et al., Microcontact Printing Directly on the Silicon Surface, Langmuir, vol. 18, No. 9 (2002), pp. 3415-3417, abstract only.
Jun et al., Patterning Protein Molecules on Poly(ethylene glycol) Coated Si(111), Biomaterials, vol. 25, (2004), pp. 3503-3509.
Karim et al., Control of Ordering Kinetics and Morphology Using Zone Annealing of Thin Block Copolymer Films, Abstract submitted for the Mar. 2007 Meeting of the American Physical Society, (Nov. 20, 2006), 2 pages.
Kavakli et al., Single and Double-Layer Antireflection Coatings on Silicon, Turk J. Phys., vol. 26, (2002), pp. 349-354.
Kim et al., Epitaxial Self-assembly of Block Copolymers on Lithographically Defined Nanopatterned Substrates, Nature, vol. 424, (Jul. 24, 2003), pp. 411-414.
Kim et al., Highly Oriented and Ordered Arrays from Block Copolymers via Solvent Evaporation, Adv. Mater. 2004, 16, No. 3, (Feb. 3, 2004), pp. 226-231.
Kim et al., Hybrid Nanofabrication Processes Utilizing Diblock Copolymer Nanotemplate Prepared by Self-assembled Monolayer Based Surface Neutralization, J. Vac. Sci. Technol. vol. B26, No. 1, (Jan./Feb. 2008), pp. 189-194.
Kim et al., In Vitro Release Behavior of Dextran-methacrylate Hydrogels Using Doxorubicin and Other Model Compounds, J Biomater Appl., vol. 15, No. 1, (Jul. 2000), pp. 23-46, abstract only.
Kim et al., Novel Complex Nanostructure from Directed Assembly of Block Copolymers on Incommensurate Surface Patterns, Adv. Mater, vol. 19, (2007), pp. 3271-3275.
Kim et al., Salt Complexation in Block Copolymer Thin Films, Macromolecules 2006, vol. 39, No. 24, (2006), pp. 8473-8479.
Kim et al., Self-assembled Hydrogel Nanoparticles Composed of Dextran and Poly (ethylene glycol) Macromer, Int J Pharm., vol. 205, No. 1-2, (Sep. 15, 2000), pp. 109-116, abstract only.
Kim et al., Solvent-Induced Ordering in Thin Film Diblock Copolymer/Homopolymer Mixtures, Advanced Mater., vol. 16, No. 23-24, (Dec. 17, 2004), pp. 2119-2123.
Kim et al., Synthesis and characterization of Dextran-methacrylate Hydrogels and Structural Study by SEM, J Biomater Res.,vol. 49, No. 4, (Mar. 15, 2000), pp. 517-527, abstract only.
Knoll et al., Phase Behavior in Thin Films of Cylinder-Forming Block Copolymers, Physical Review Letters, vol. 89, No. 3, (Jul. 15, 2002), pp. 035501-1 to 035501-4.
Yu et al., Contact Printing Beyond Surface Roughness: Liquid Supramolecular Nanostamping, Advanced Materials, vol. 19, (2007), pp. 4338-4342.
Yurt et al., Scission of Diblock Copolymers into Their Constituent Blocks, Macromolecules 2006, vol. 39, No. 5, (2006), pp. 1670-1672.
1. Zaumseil et al., Three-Dimensional and Multilayer Nanostructures Formed by Nanotransfer Printing, Nano Letters, vol. 3, No. 9,(2003), pp. 1223-1227.
Zehner et al., Selective Decoration of a Phase-Separated Diblock Copolymer with Thiol-Passivated Gold Nanocrystals, Langmuir, vol. 14, No. 2, (Jan. 20, 1998), pp. 241-244.
Zhang et al., Highly Ordered Nanoporous Thin Films from Cleavable Polystyrene-block-poly(ethylene oxide),Adv. Mater., vol. 19, (2007), pp. 1571-1576.

(56) References Cited

OTHER PUBLICATIONS

Zhang et al., Phase Change Nanodot Arrays Fabricated Using a Self-Assembly Diblock Copolymer Approach, Applied Physics Letter, vol. 91, (2007), pp. 013104-013104-3.
Zhang Et Al., Self-Assembled Monolayers of Terminal Alkynes on Gold, J. Am. Chem. Soc., vol. 129, No. 16, (2007), pp. 4876-4877.
Zhao et al., Colloidal Subwavelength Nanostructures for Antireflection Optical Coatings, Optics Letters, vol. 30, No. 14, (Jul. 15, 2005), pp. 1885-1887.
Zhou et al., Nanoscale Metal/Self-Assembled Monolayer/Metal Heterostructures, Appl. Phys. Lett., vol. 71, No. 5, (Aug. 4, 1997), pp. 611-613.
Zhu et al., Grafting of High-Density Poly(Ethylene Glycol) Monolayers on Si(111), Langmuir, vol. 17, (2001), pp. 7798-7803.
Zhu et al., Molecular Assemblies on Silicon Surfaces via Si—O Linkages, Langmuir, vol. 16, (2000), pp. 6766-6772.
Potemkin et al., Effect of the Molecular Weight of AB Diblock Copolymers on the Lamellar Orientation in Thin Films: Theory and Experiment, Macromol. Rapid Commun., (2007), 28, pp. 579-584.
Reed et al., Molecular Random Access Memory Cell, Appl. Phys. Lett., vol. 78, No. 23, (Jun. 4, 2001), pp. 3735-3737.
Resnick et al., Initial Study of the Fabrication of Step and Flash Imprint Lithography Templates for the Printing of Contact Holes, Microlith., Microfab., Microsyst., vol. 3, No. 2, (Apr. 2004), pp. 316-321.
Rogers, J. A., Slice and Dice, Peel and Stick: Emerging Methods for Nanostructure Fabrication, ACS Nano, vol. 1, No. 3, (2007), pp. 151-153.
Rozkiewicz, Dorota I., et al., 'Click' Chemistry by Microcontact Printing, Angew. Chem. Int. Ed., vol. 45, (Jul. 12, 2006); pp. 5292-5296, 2006.
Ruiz et al., Density Multiplication and Improved Lithography by Directed Block Copolymer Assembly, Science, vol. 321, (Aug. 15, 2008), pp. 936-939.
Ruiz et al., Induced Orientational Order in Symmetric Diblock Copolymer Thin-Films, Advanced Materials, vol. 19, No. 4, (2007), pp. 587-591.
Ryu et a., Surface Modification with Cross-Linked Random Copolymers: Minimum Effective Thickness, Macromolecules, vol. 40, No. 12, (2007), pp. 4296-4300.
Sang et al., Epitaxial Self-Assembly of Block Copolymers on Lithographically Defined Nanopatterned Substrates, Nature, vol. 24, (Jul. 24, 2003), pp. 411-414.
Saraf et al., Spontaneous Planarization of Nanoscale Phase Separated Thin Film, Applied Physics Letters, vol. 80, No. 23, (Jun. 10, 2002), pp. 4425-4427.
Sato et al., Novel Antireflective Layer Using Polysilane for Deep Ultraviolet Lithography, J. Vac. Sci. Technol. B, vol. 17, No. 6, (Nov./Dec. 1999), pp. 3398-3401.
Sawhney et al., Bioerodible Hydrogels Based on Photopolymerized Poly(ethylene glycol)-co-poly(a-hydroxy acid) Diacrylate Macromers, Macromolecules 1993, vol. 26, (1993), pp. 581-587, abstract only.
Search Report of the IPO, Taiwanese Application No. 098109253, issued Aug. 22, 2012, one page.
Segalman, R. A., Patterning with Block Copolymer Thin Films, Materials Science and Engineering R 48, (2005), pp. 191-226.
Shahrjerdi et al., Fabrication of Ni Nanocrystal Flash Memories Using a Polymeric Self-Assembly Approach, IEEE Electron Device Letters, vol. 28, No. 9, (Sep. 2007), pp. 793-796.
Sharma et al., Ultrathin Poly(ethylene glycol) Films for Silicon-based Microdevices, Applied Surface Science, vol. 206, (2003), pp. 218-229.
Sigma-Aldrich, 312-315 Tutorial regarding Materials for Lithography/Nanopatterning, http://www.sigmaaldrich.com/Area_of_Interest/Chemistry/Materials_Science/Micro_and_Nanoelectronic website, (retrieved Aug. 27, 2007), 8 pages.
Sivaniah et al., Observation of Perpendicular Orientation in Symmetric Diblock Copolymer Thin Films on Rough Substrates, Macromolecules 2003, vol. 36, (2003), pp. 5894-5896.
Sivaniah et al., Symmetric Diblock Copolymer Thin Films on Rough Substrates, Kinetics and Structure Formation in Pure Block Copolymer Thin Films, Macromolecules 2005, vol. 38, (2005), pp. 1837-1849.
Sohn et al., Fabrication of the Multilayered Nanostructure of Alternating Polymers and Gold Nanoparticles with Thin Films of Self-Assembling Diblock Copolymers, Chem. Mater., vol. 13, (2001), pp. 1752-1757.
Solak, H. H., Nanolithography with Coherent Extreme Ultraviolet Light, Journal of Physics D: Applied Physics, vol. 39, (2006), pp. R171-188.
Srinvivasan et al., Scanning Electron Microscopy of Nanoscale Chemical Patterns, ACS Nano, vol. 1, No. 3, (2007), pp. 191-201.
Stoykovich et al., Directed Assembly of Block Copolymer Blends into Nonregular Device-Oriented Structures, Science, vol. 308, (Jun. 3, 2005), pp. 1442-1446.
Stoykovich, M. P., et al., Directed Self-Assembly of Block Copolymers for Nanolithography: Fabrication of Isolated Features and Essential Integrated Circuit Geometries, ACS Nano, vol. 1, No. 3, (2007), pp. 168-175.
Sundrani et al., Guiding Polymers to Perfection: Macroscopic Alignment of Nanoscale Domains, Nano Lett., vol. 4, No. 2, (2004), pp. 273-276.
Sundrani et al., Hierarchical Assembly and Compliance of Aligned Nanoscale Polymer Cylinders in Confinement, Langmuir 2004, vol. 20, No. 12, (2004), pp. 5091-5099.
Tadd et al, Spatial Distribution of Cobalt Nanoclusters in Block Copolymers, Langmuir, vol. 18, (2002), pp. 2378-2384.
Tang et al., Evolution of Block Copolymer Lithography to Highly Ordered Square Arrays, Science, vol. 322, No. 5900, (Sep. 25, 2008), pp. 429-432.
Trimbach et al., Block Copolymer Thermoplastic Elastomers for Microcontact Printing, Langmuir, vol. 19, (2003), pp. 10957-10961.
Truskett et al., Trends in Imprint Lithography for Biological Applications, Trends in Biotechnology, vol. 24, No. 7, (Jul. 2006), pp. 312-315.
Tseng et al., Enhanced Block Copolymer Lithography Using Sequential Infiltration Synthesis, J. of Physical Chemistry, (Jul. 11, 2011), 16 pgs.
Van Poll et al., Self-Assembly Approach to Chemical Micropatterning of Poly(dimethylsiloxane), Angew. Chem. Int. Ed. 2007, vol. 46, (2007), pp. 6634-6637.
Wang et al., One Step Fabrication and characterization of Platinum Nanopore Electrode Ensembles formed via Amphiphilic Block Copolymer Self-assembly, Electrochimica Acta 52, (2006), pp. 704-709.
Wathier et al., Dendritic Macromers as in Situ Polymerizing Biomaterials for Securing Cataract Incisions, J. Am. Chem. Soc., vol. 126, No. 40, (2004), pp. 12744-12745, abstract only.
Winesett et al., Tuning Substrate Surface Energies for Blends of Polystyrene and Poly(methyl methacrylate), Langmuir 2003, vol. 19, (2003), pp. 8526-8535.
WIPF, Handbook of Reagents for Organic Synthesis, John Wiley & Sons Ltd., (2005), p. 320.
Wu et al., Self-Assembled Two-Dimensional Block Copolymers on Pre-patterned Templates with Laser Interference Lithography, IEEE, (2007), pp. 153-154.
Xia et al., An Approach to Lithographically Defined Self-Assembled Nanoparticle Films, Advanced Materials, vol. 18, (2006), pp. 930-933.
Xia et al., Soft Lithography, Annu. Rev. Mater. Sci., vol. 28, (1998), pp. 153-184.
Xiao et al., Graphoepitaxy of Cylinder-forming Block Copolymers for Use as Templates to Pattern Magnetic Metal Dot Arrays, Nanotechnology 16, IPO Publishing Ltd, UK (2005), pp. S324-S329.
Xu et al., Electric Field Alignment of Symmetric Diblock Copolymer Thin Films, Macromolecules, (2003), 5 pgs.
Xu et al., Interfacial Interaction Dependence of Microdomain Orientation in Diblock Copolymer Thin Films, Macromolecules, vol. 38, (2005), pp. 2802-2805.

(56) References Cited

OTHER PUBLICATIONS

Xu et al., Surface-Initiated Atom Transfer Radical Polymerization from Halogen-Terminated Si(111) (Si—X, X =Cl, Br) Surfaces for the Preparation of Well-Defined Polymer-Si Hybrids, Langmuir, vol. 21, No. 8, (2005), pp. 3221-3225.

Xu et al., The Influence of Molecular Weight on Nanoporous Polymer Films, Polymer 42, Elsevier Science Ltd., (2001), pp. 9091-9095.

Yamaguchi et al., Resist-Pattern Guided Self-Assembly of Symmetric Diblock Copolymer, Journal of Photopolymer Science and Technology, vol. 19, No. 3, (2006), pp. 385-388.

Yamaguchi et al., Two-dimensional Arrangement of Vertically Oriented Cylindrical Domains of Diblock Copolymers Using Graphoepitaxy with Artificial Guiding Pattern Layout, Microprocesses and Nanotechnology, 2007, Conference date Nov. 5-8, 2007, pp. 434-435.

Yan et al., Preparation and Phase Segregation of Block Copolymer Nanotube Multiblocks, J. Am. Chem. Soc., vol. 126, No. 32, (2004), pp. 10059-10066.

Yang et al., Covalently Attached Graft Polymer Monolayer on Organic Polymeric Substrate via Confined Surface Inhibition Reaction, J. Polymer Sci.-A-Polymer Chemistry Ed., vol. 45, Issue 5, (2007), pp. 745-755.

Yang et al., Guided Self-Assembly of Symmetric Diblock Copolymer Films on Chemically Nanopatterned Substrates, Macromolecules 2000, vol. 33, No. 26, (2000), pp. 9575-9582.

Yang et al., Nanoscopic Templates Using Self-assembled Cylindrical Diblock Copolymers for Patterned Media, J. Vac. Sci. Technol. B 22(6), (Nov./Dec. 2004), pp. 3331-3334.

Li, H, W. Huck; "Ordered Block-Copolymer Assembly Using Nanoimprint Lithography". Nano. Lett (2004), vol. 4, No. 9, p. 1633-1636.

Cheng, J., C. Ross, H. Smith, E. Thomas; "Templated Self-Assembly of Block Copolymers: Top-Down Helps Bottom-Up". Adv. Mater. (2006), 18, p. 2505-2521.

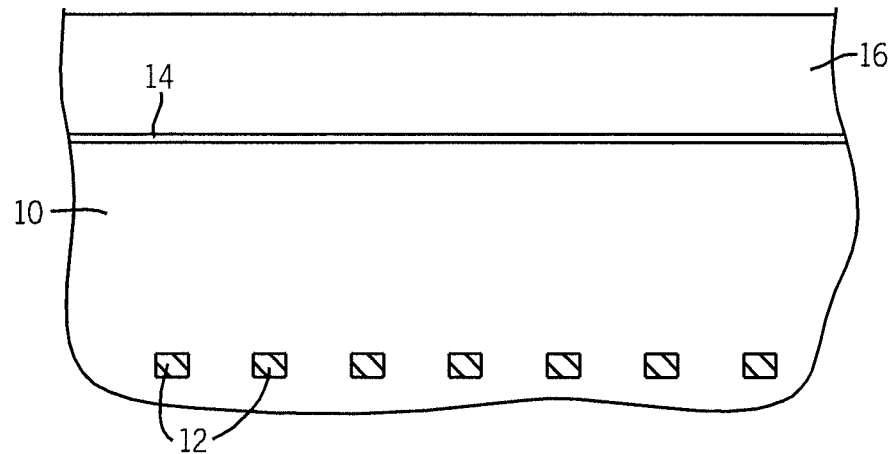
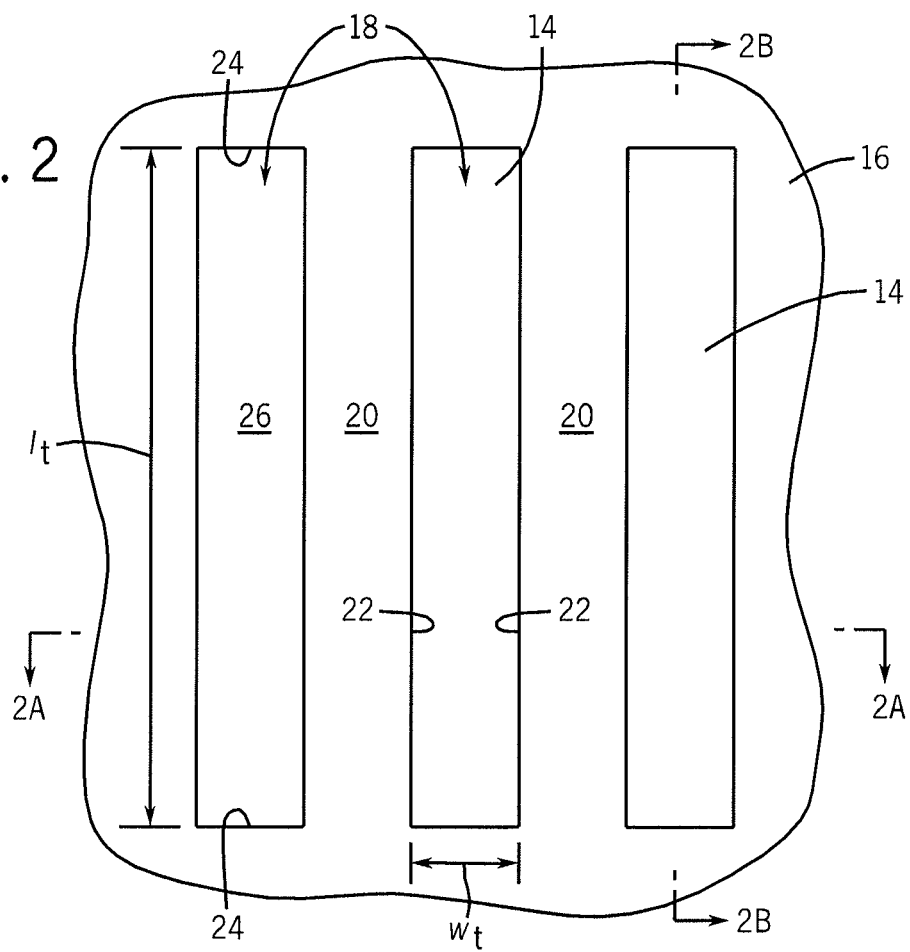

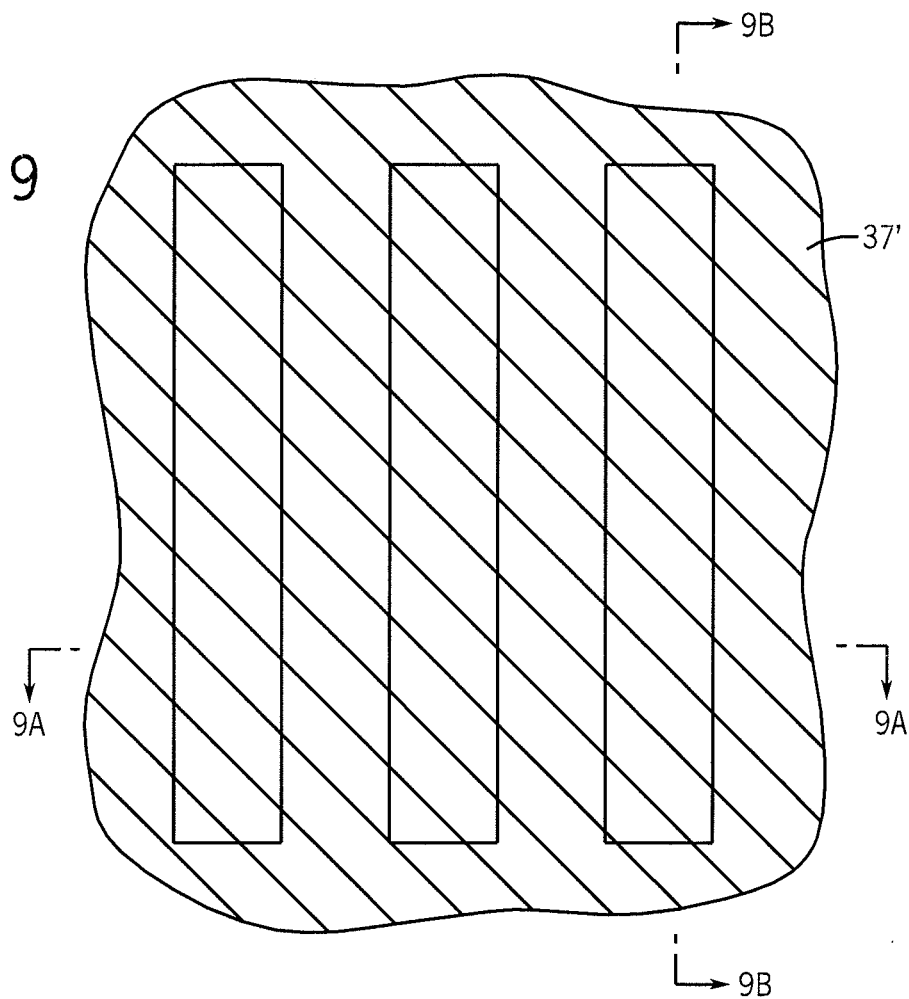
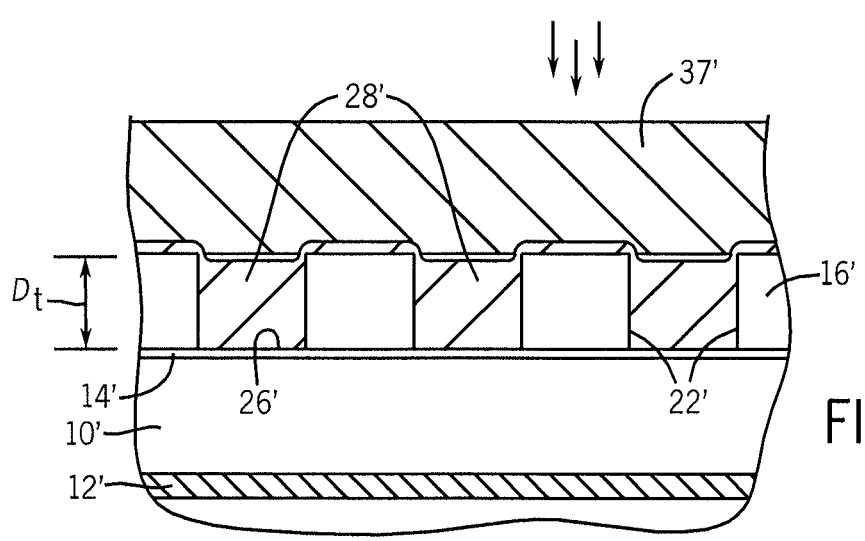

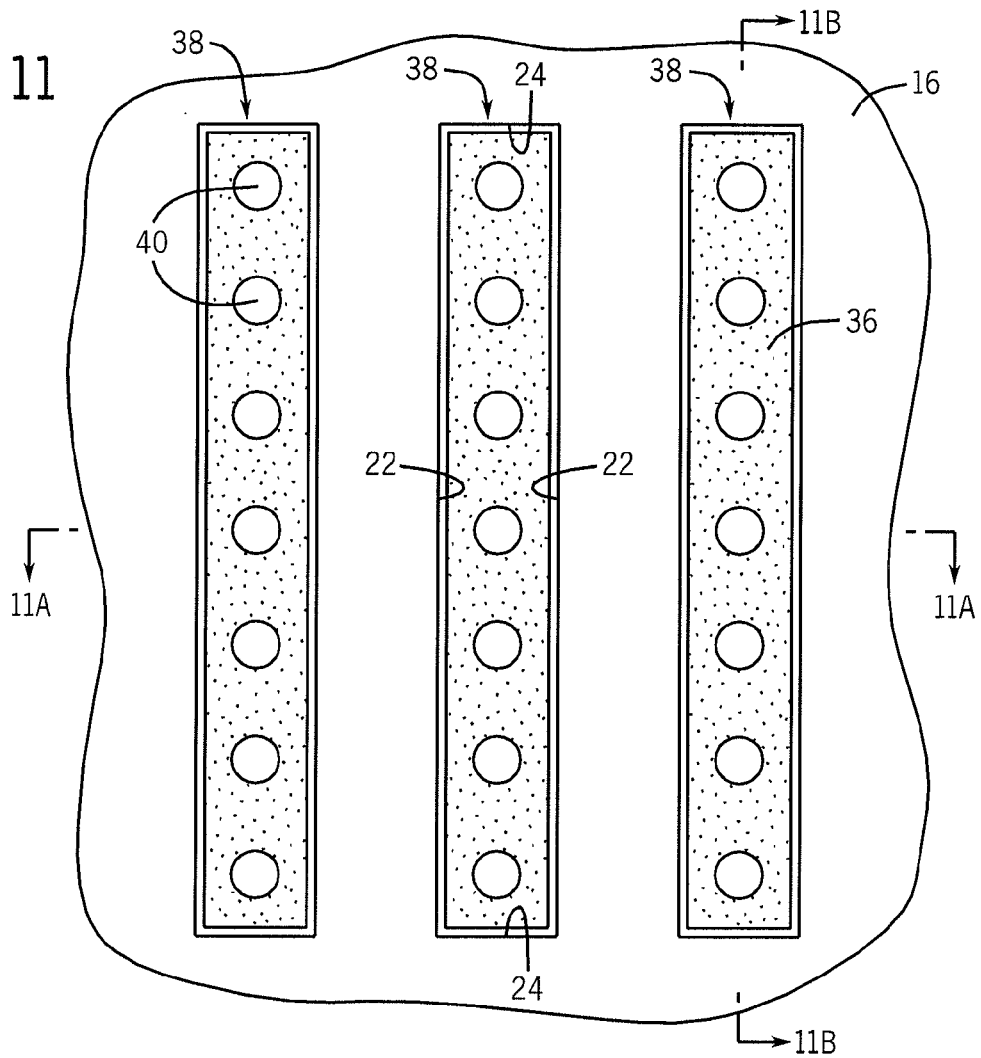
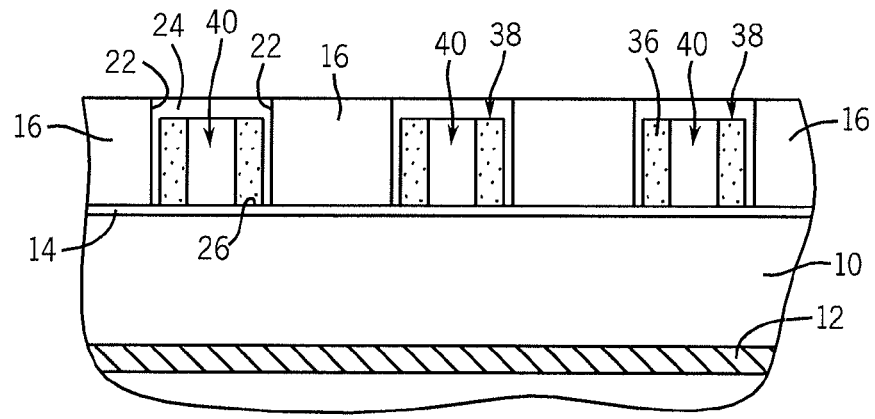

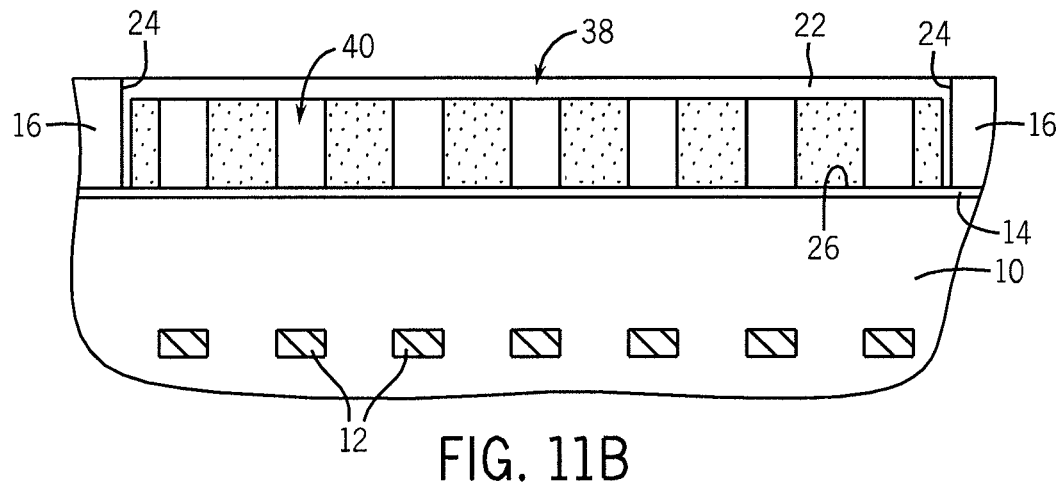
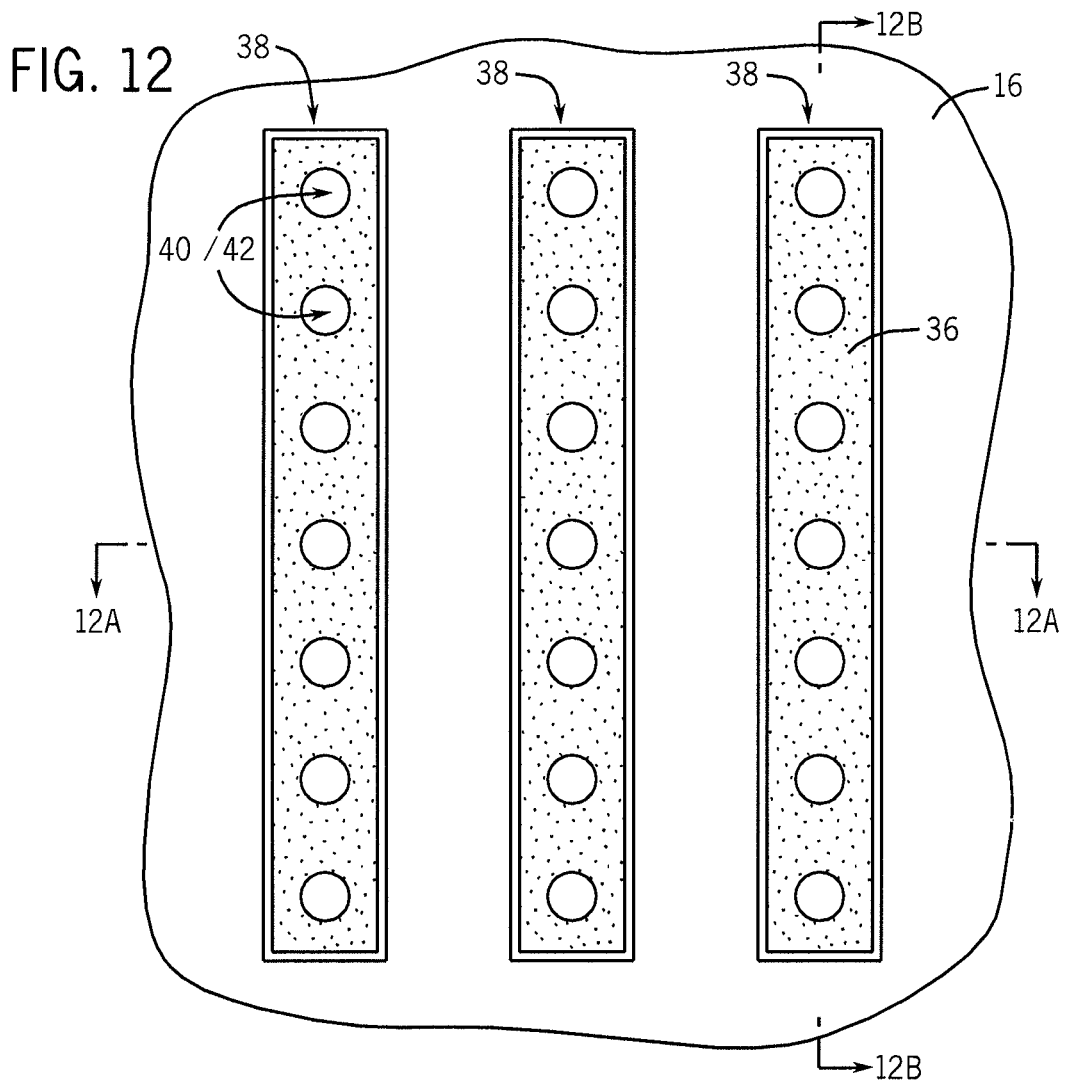

THERMAL ANNEAL OF BLOCK COPOLYMER FILMS WITH TOP INTERFACE CONSTRAINED TO WET BOTH BLOCKS WITH EQUAL PREFERENCE

CROSS-REFERENCE TO RELATED APPLICATIONS

This application is a divisional of U.S. patent application Ser. No. 13/469,697, filed May 11, 2012, now U.S. Pat. No. 8,633,112, issued Jan. 21, 2014, which is a continuation of U.S. patent application Ser. No. 12/052,956, filed Mar. 21, 2008, now U.S. Pat. No. 8,426,313, issued Apr. 23, 2013.

TECHNICAL FIELD

Embodiments of the invention relate to methods of fabricating thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Making electrical contacts to conductive lines has become a significant challenge as the dimensions of semiconductor features shrink to sizes that are not easily accessible by conventional lithography. Optical lithographic processing methods have difficulty fabricating structures and features at the sub-60 nanometer level. The use of self-assembling diblock copolymers presents another route to patterning at nanoscale dimensions. Diblock copolymer films spontaneously assembly into periodic structures by microphase separation of the constituent polymer blocks after annealing, for example, by thermal annealing above the glass transition temperature of the polymer or by solvent annealing, forming ordered domains at nanometer-scale dimensions.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5-50 nm.

Many applications of the self-assembly of block copolymers (BCPs) to lithography require that the self-assembled domains orient perpendicular to the substrate with both domains wetting and exposed at the air interface. With selective removal of one of the polymer blocks to form an etch mask, the perpendicularly oriented void structures can then be used for etching the underlying substrate.

Conventional thermal annealing of most BCPs (e.g., PS-b-PVP, etc.) in air or vacuum will typically result in one block preferentially wetting the air vapor interface. A variant of thermal annealing called zone annealing, can provide rapid self-assembly (e.g., on the order of minutes) but is only effective for a small number of BCPs (e.g., PS-b-PMMA, PS-b-PLA) with polymer domains that equally wet the air vapor interface. Solvent annealing of BCPs has been used to produce a perpendicular orientation of the self-assembled domains to the substrate, but is generally a very slow process, typically on the order of days, and can require large volumes of the solvent. A typical solvent anneal is conducted by exposing a BCP film to a saturated solvent atmosphere at 25° C. for at least 12 hours (often longer).

It would be useful to provide methods of fabricating films of arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

FIGS. 1A and 1B are elevational, cross-sectional views of the substrate depicted in FIG. 1 taken along lines 1A-1A and 1B-1B, respectively.

FIG. 2 illustrates a diagrammatic top plan view of the substrate of FIG. 1 at a subsequent stage showing the formation of trenches in a material layer formed on the neutral wetting material.

FIGS. 6A-8A illustrate elevational, cross-sectional views of the substrate depicted in FIGS. 6-8 taken along lines 6A-6A, 7A-7A and 8A-8A, respectively, showing an embodiment of a heating device for zone annealing the film.

FIG. 9 is a top plan view of the substrate of FIG. 5 at a subsequent stage according to another embodiment of a method of the invention, illustrating placement of a non-preferential wetting material over the block copolymer material during an anneal. FIGS. 9A and 9B are elevational, cross-sectional views of the substrate depicted in FIG. 9 taken along lines 9A-9A and 9B-9B, respectively.

FIGS. 11-13 are top plan views of the substrate of FIG. 8 at subsequent stages, illustrating an embodiment of the use of the self-assembled block copolymer film after removal of one of the polymer blocks, as a mask to etch the substrate and filling of the etched openings. FIGS. 11A-13A illustrate elevational, cross-sectional views of a portion of the substrate depicted in FIGS. 11-13 taken along lines 11A-11A to 13A-13A, respectively.

FIGS. 11B-13B are cross-sectional views of the substrate depicted in FIGS. 11-13 taken along lines 11B-11B to 13B-13B, respectively.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the terms "semiconductor substrate," or "semiconductive substrate," or "semiconductive wafer fragment," or "wafer fragment," or "wafer," will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" as used herein is the inherent periodicity or pitch value (bulk period or repeat unit) of structures that self-assemble upon annealing from a self-assembling (SA) block copolymer. "$L_B$" as used herein is the periodicity or pitch value of a blend of a block copolymer with one or more of its constituent homopolymers. "L" is used herein to indicate the center-to-center cylinder pitch or spacing of cylinders of the block copolymer or blend, and is equivalent to "$L_o$" for a pure block copolymer and "$L_B$" for a copolymer blend.

In embodiments of the invention, a polymer material (e.g., film, layer) is prepared by guided self-assembly of block copolymers, with both polymer domains at the air interface. The block copolymer material spontaneously assembles into periodic structures by microphase separation of the constituent polymer blocks after annealing, forming ordered domains of perpendicular-oriented cylinders at nanometer-scale dimensions within a trench.

A method for fabricating a self-assembled block copolymer material that defines a one-dimensional (1D) array of nanometer-scale, perpendicular-oriented cylinders according to an embodiment of the invention is illustrated with reference to FIGS. 1-8.

The described embodiment involves a thermal anneal of a cylindrical-phase block copolymer under a solvent atmosphere. The anneal is conducted in combination with a graphoepitaxy technique that utilizes a lithographically defined trench as a guide with a floor composed of a material that is neutral wetting to both polymer blocks, and sidewalls and ends that are preferential wetting to one polymer block and function as constraints to induce the block copolymer to self-assemble into an ordered 1D array of a single row of cylinders in a polymer matrix oriented perpendicular to the trench floor and registered to the trench sidewalls. In some embodiments, two or more rows of perpendicular-oriented cylinders can be formed in each trench.

Figure 1:
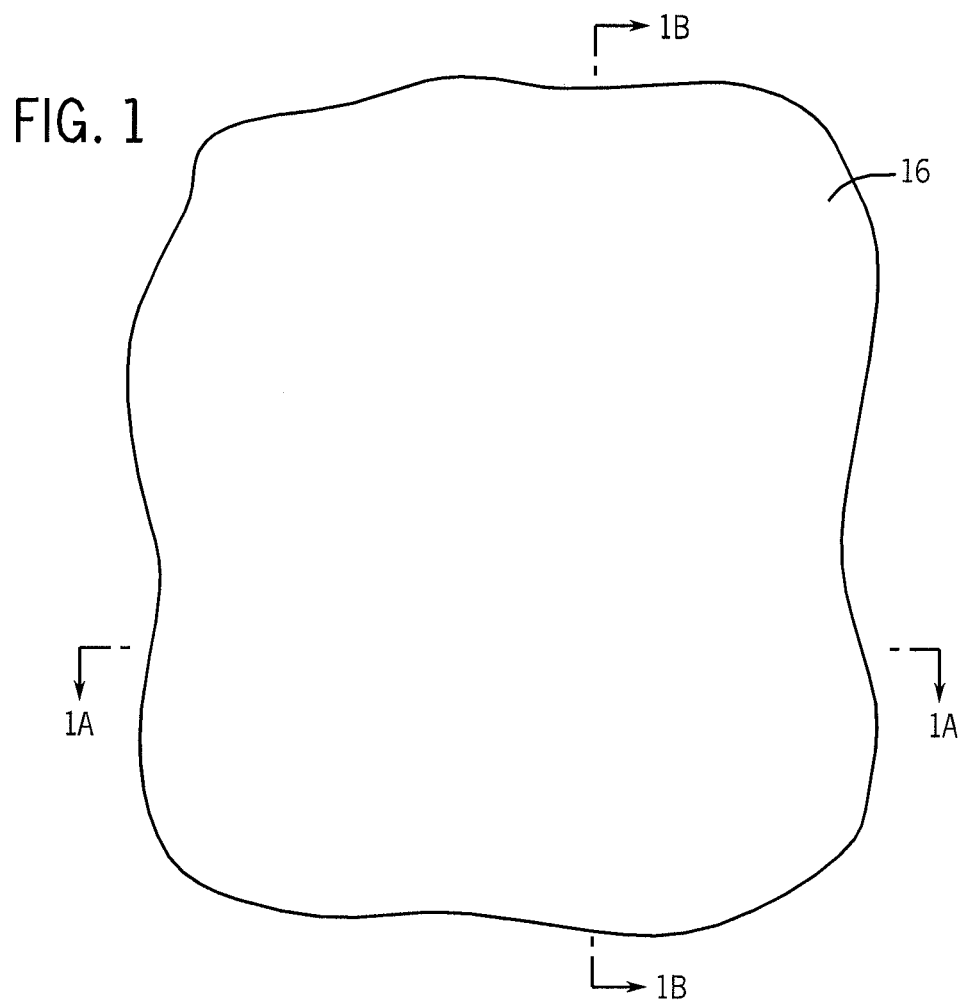
FIG. 1 illustrates a diagrammatic top plan view of a portion of a substrate at a preliminary processing stage according to an embodiment of the present disclosure, showing the substrate with a neutral wetting material thereon.
Figure 1A:
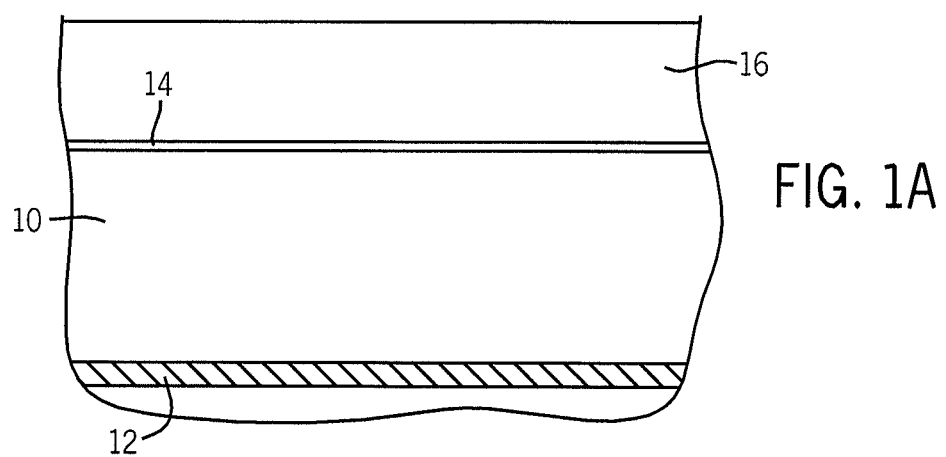

As depicted in FIGS. 1-1B, a substrate 10 is provided, which can be silicon, silicon oxide, silicon nitride, silicon oxynitride, silicon oxycarbide, among other materials. As further depicted, conductive lines 12 (or other active area, e.g., semiconducting regions) are situated within the substrate 10.

In any of the described embodiments, a single trench or multiple trenches can be fainted in the substrate, and can span the entire width of an array of lines (or other active area). In embodiments of the invention, the substrate 10 is provided with an array of conductive lines 12 (or other active areas) at a pitch of L. The trench or trenches are formed over the active areas 12 (e.g., lines) such that when the block copolymer material is annealed, each cylinder will be situated above a single active area 12 (e.g., a conductive line). In some embodiments, multiple trenches 18 are formed with the ends 24 of each adjacent trench 18 aligned or slightly offset from each other at less than 5% of L such that cylinders in adjacent trenches 18 are aligned and situated above the same conductive line 12.

Figure 2A:
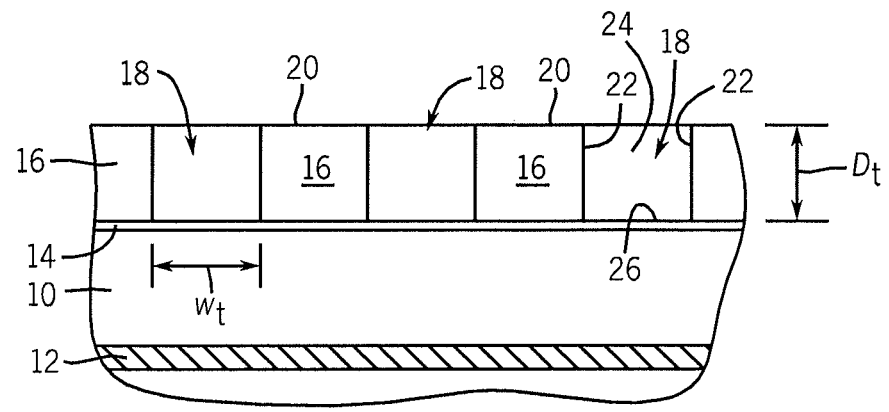
FIGS. 2A and 2B illustrate elevational, cross-sectional views of a portion of the substrate depicted in FIG. 2 taken, respectively, along lines 2A-2A and 2B-2B.
Figure 2B:
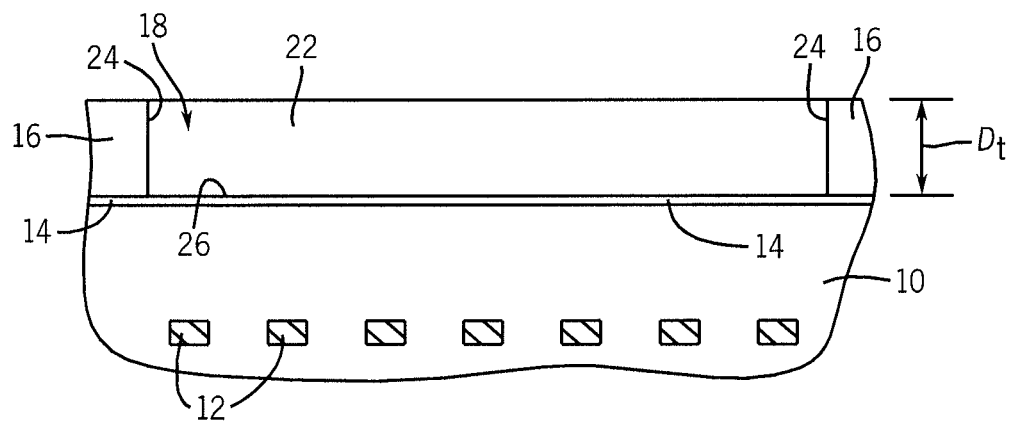

In the illustrated embodiment, a neutral wetting material 14 (e.g., random copolymer) has been formed over the substrate 10. A material layer 16 (or one or more material layers) can then be formed over the neutral wetting material 14 and etched to form trenches 18 that are oriented perpendicular to the array of conductive lines 12, as shown in FIGS. 2-2B. Portions of the material layer 16 form a spacer 20 outside and between the trenches. The trenches 18 are structured with opposing sidewalls 22, opposing ends 24, a floor 26, a width ($w_t$), a length ($l_t$) and a depth ($D_t$).

Figure 3:
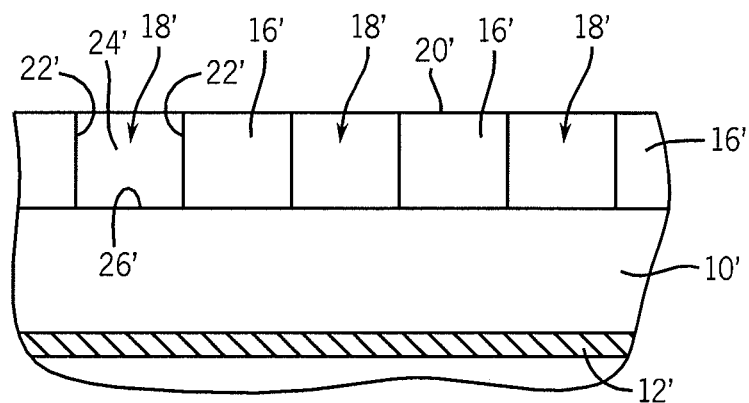
FIG. 3 illustrates a side elevational view of a portion of a substrate at a preliminary processing stage according to another embodiment of the disclosure, showing the substrate with trenches in a material layer formed on the substrate.
Figure 4:
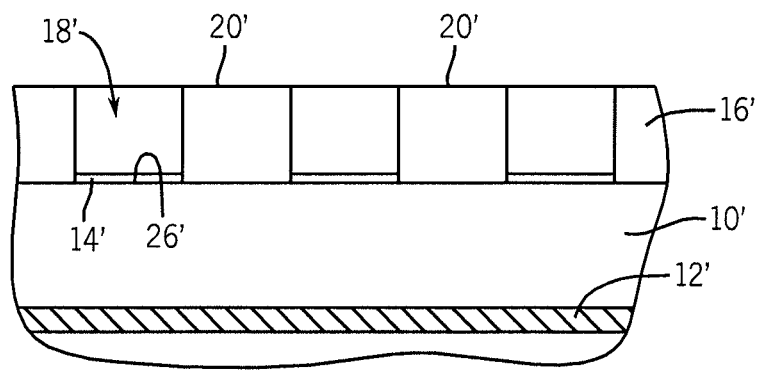
FIG. 4 illustrates a side elevational view of the substrate of FIG. 3 at a subsequent stage showing the formation of a neutral wetting material within the trenches.

In another embodiment, the material layer 16' can be formed on the substrate 10', etched to form the trenches 18' as depicted in FIG. 3, and a neutral wetting material 14' can then be formed on the trench floors 26' as shown in FIG. 4. For example, a random copolymer material can be deposited into the trenches 18' and crosslinked to form a neutral wetting material layer. Material on surfaces outside the trenches 18' such as on the spacers 20' (e.g., non-crosslinked random copolymer) can be subsequently removed.

Single or multiple trenches 18 (as shown) can be formed using a lithographic tool having an exposure system capable of patterning at the scale of L (10-100 nm). Such exposure systems include, for example, extreme ultraviolet (EUV) lithography, proximity X-rays and electron beam (E-beam) lithography, as known and used in the art. Conventional photolithography can attain (at smallest) about 58 nm features.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev, et al.), U.S. Patent Publication 2006/0281266 (U.S. Pat. No. 7,396,781, issued Jul. 8, 2008, to Wells) and U.S. Patent Publication 2007/0023805 (U.S. Pat. No. 7,776,715, issued Aug. 17, 2010, to Wells). Briefly, a pattern of lines is photolithographically formed in a photoresist material overlying a layer of an expendable material, which in turn overlies a substrate, the expendable material layer is etched to form placeholders or mandrels, the photoresist is stripped, spacers are formed on the sides of the mandrels, and the mandrels are then removed, leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or less.

Factors in forming a single 1D array or layer of perpendicular-oriented nanocylinders within the trenches include the width ($w_t$) and depth ($D_t$) of the trench, the formulation of the block copolymer or blend to achieve the desired pitch (L), and the thickness (t) of the block copolymer material within the trench.

There is a shift from two rows to one row of the perpendicular cylinders within the center of the trench 18 as the width ($w_t$) of the trench 18 is decreased and/or the periodicity (L value) of the block copolymer is increased, for example, by forming a ternary blend by the addition of both constituent homopolymers. The boundary conditions of the trench sidewalls 22 in both the x- and y-axis impose a structure wherein each trench 18 contains "n" number of features (e.g., cylinders). For example, a block copolymer or blend having a pitch or L value of 35-nm deposited into a 75-nm wide trench 18 having a neutral wetting floor will, upon annealing, result in a zigzag pattern of 17.5-nm diameter ($\cong 0.5*L$) perpendicular cylinders that are offset by about one-half the pitch distance (about 0.5*L) for the length ($l_t$) of the trench 18, rather than a single line row of perpendicular cylinders aligned with the sidewalls 22 down the center of the trench 18.

In the illustrated embodiment, the trenches 18 are constructed with a width ($w_t$) of about 1.5-2*L (or 1.5-2×the pitch value) of the block copolymer such that a cast block copolymer material (or blend) of about L will self-assemble upon annealing into a single row of perpendicular cylinders (diameter$\cong 0.5*L$) with a center-to-center pitch distance (p) of adjacent cylinders at or about L. For example, in using a cylindrical phase block copolymer with an about 50 nm pitch value or L, the width ($w_t$) of the trenches 18 can be about 1.5-2*50 nm or about 75-100 nm. The length ($l_t$) of the trenches 18 is at or about n*L or an integer multiple of L, typically within a range of about n*10 to about n*100 nm (with n being the number of features or structures, e.g., cylinders). The depth ($D_t$) of the trenches 18 is greater than or equal to L ($D_t \geq L$). The width of the spacers 20 between adjacent trenches can vary and is generally about L to about n*L. In some embodiments, the trench dimension is about 20-100 nm wide ($w_t$) and about 100-25,000 nm in length ($l_t$), with a depth ($D_t$) of about 10-100 nm.

Figure 5:
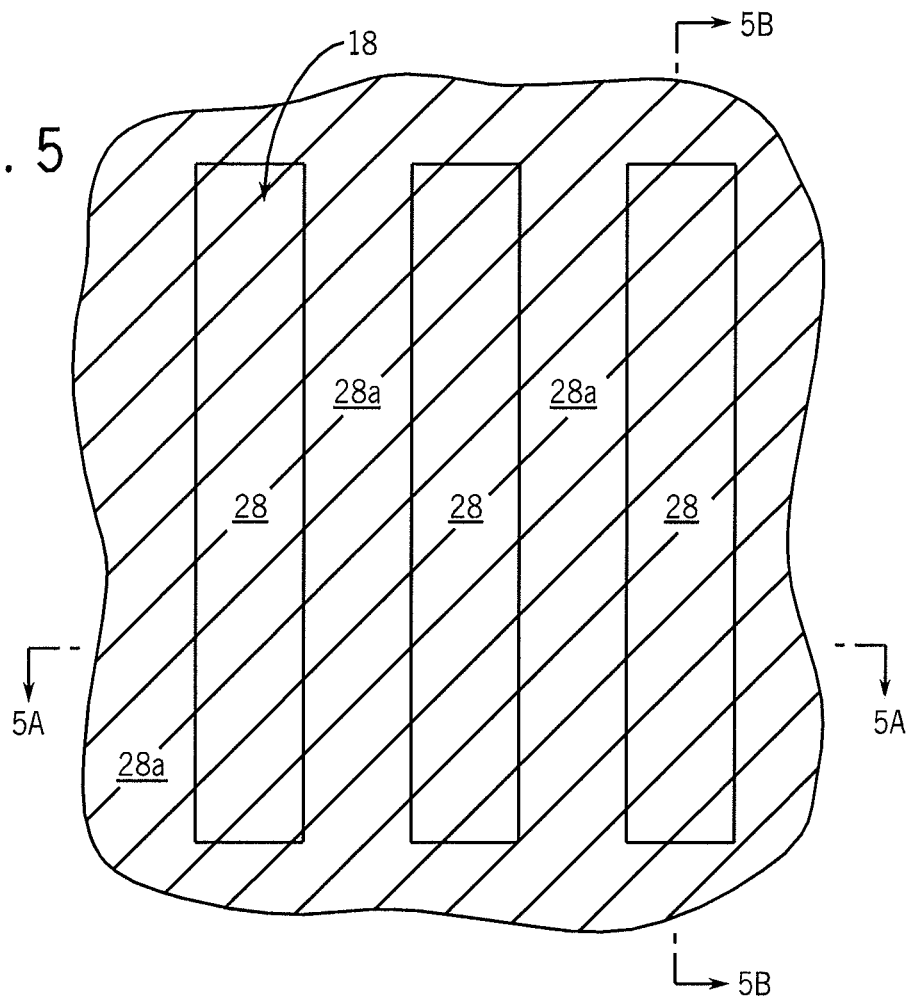
FIG. 5 is a diagrammatic top plan view of the substrate of FIG. 2 at a subsequent stage showing a block copolymer material within the trenches.
Figure 5A:
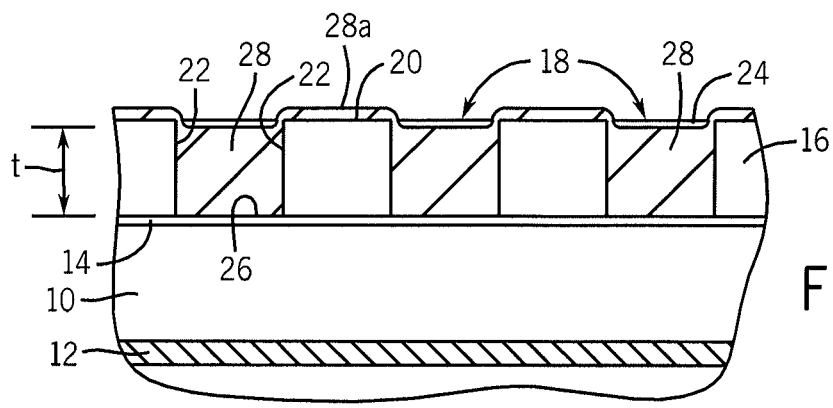
FIGS. 5A and 5B illustrate elevational, cross-sectional views of a portion of the substrate depicted in FIG. 5 taken along lines 5A-5A and 5B-5B, respectively.
Figure 5B:
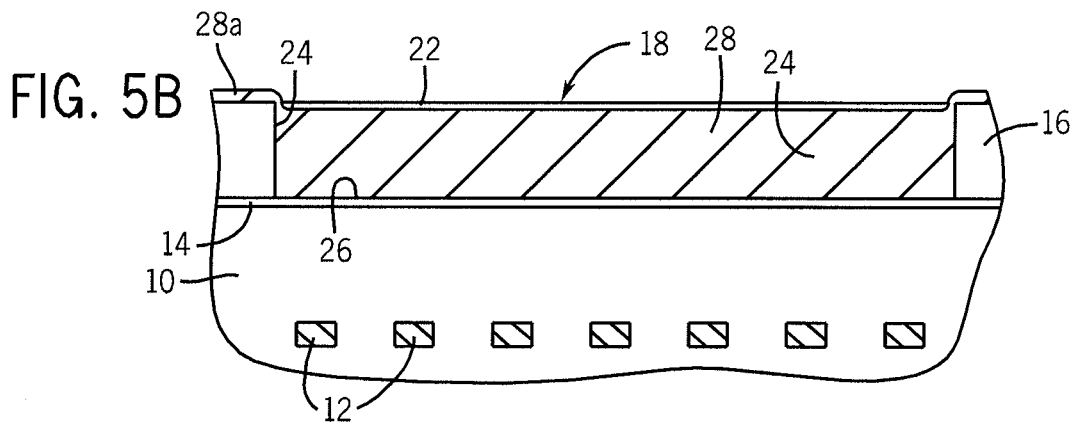

A self-assembling, cylindrical-phase block copolymer material 28 having an inherent pitch at or about $L_o$ (or a ternary blend of block copolymer and homopolymers blended to have a pitch at or about $L_B$) is deposited into the trenches 18, typically as a film (as in FIGS. 5-5B).

The block copolymer (or blend) is constructed such that all of the polymer blocks will have equal preference for a neutral wetting material on the trench floor. The block copolymer material can be constructed to provide desired properties such as defect tolerance and ease of development and/or removal of one of the blocks. In some embodiments of the invention, the block copolymer or blend is constructed such that the minor domain can be selectively removed.

Examples of diblock copolymers include, for example, poly(styrene)-b-poly(vinylpyridine) (PS-b-PVP), poly(styrene)-b-poly(methyl methacrylate) (PS-b-PMMA) or other PS-b-poly(acrylate) or PS-b-poly(methacrylate), poly(styrene)-b-poly(lactide) (PS-b-PLA), poly(styrene)-b-poly(tert-butyl acrylate) (PS-b-PtBA), and poly(styrene)-b-poly(ethylene-co-butylene (PS-b-(PS-co-PB)), poly(styrene)-b-poly (ethylene oxide) (PS-b-PEO), poly(isoprene)-b-poly (ethyleneoxide) (PI-b-PEO), poly(isoprene)-b-poly(methyl methacrylate) (PI-b-PMMA), poly(butadiene)-b-poly(ethyleneoxide) (PBD-b-PEO), a PS-b-PEO block copolymer having a cleavable junction such as a triphenylmethyl (trityl) ether linkage between PS and PEO blocks (optionally complexed with a dilute concentration (e.g., about 1 wt %) of a salt such as KCl, KI, LiCl, LiI, CsCl or CsI (Zhang et al., *Adv. Mater.* 2007, 19, 1571-1576), a PS-b-PMMA block copolymer doped with PEO-coated gold nanoparticles of a size less than the diameter of the self-assembled cylinders (Park et al., *Macromolecules,* 2007, 40 (11), 8119-8124), and a poly(styrene)-b-poly(2-vinylpyridine) (PS-b-P2VP) block copolymer having a cleavable junction such as a dithiol group, among others, with PS-b-PVP used in the illustrated embodiment. Other types of block copolymers (i.e., triblock or multiblock copolymers) can be used. Examples of triblock copolymers include ABC copolymers such as poly(styrene-b-methyl methacrylate-b-ethylene oxide) (PS-b-PMMA-b-PEO), and ABA copolymers, such as PS-PMMA-PS, PMMA-PS-PMMA, and PS-b-PI-b-PS, among others.

The film morphology, including the domain sizes and periods ($L_o$) of the microphase-separated domains, can be controlled by chain length of a block copolymer (molecular weight, MW) and volume fraction of the AB blocks of a diblock copolymer to produce cylindrical morphologies (among others). For example, for volume fractions at ratios of the two blocks generally between about 60:40 and 80:20 (A:B), the diblock copolymer will microphase separate and self-assemble into periodic cylindrical domains of polymer B within a matrix of polymer A. An example of a cylinder-forming PS-b-PVP copolymer material ($L_o$~28 nm) to form about 14 nm diameter cylindrical PVP domains in a matrix of PS is composed of about 70 wt % PS and 30 wt % PVP with a total molecular weight ($M_n$) of 44.5 kg/mol. An example of a cylinder-forming PS-b-PMMA copolymer material ($L_o$=35 nm) to form about 20 nm diameter cylindrical PMMA domains in a matrix of PS is composed of about 70 wt % PS and 30 wt % PMMA with a total molecular weight ($M_n$) of 67 kg/mol. As another example, a PS-b-PLA copolymer material (L=49 nm) can be composed of about 71 wt % PS and 29 wt % PLA with a total molecular weight ($M_n$) of about 60.5 kg/mol to form about 27 nm diameter cylindrical PLA domains in a matrix of PS.

The L value of the block copolymer can be modified, for example, by adjusting the molecular weight of the block copolymer. The block copolymer material can also be formulated as a binary or ternary blend comprising a block copolymer and one or more homopolymers (HPs) of the same type of polymers as the polymer blocks in the block copolymer, to produce a blend that will swell the size of the polymer domains and increase the L value. The concentration of homopolymers in the blend can range from 0 to about 60 wt %.

An example of a ternary diblock copolymer blend is a PS-b-P2VP/PS/P2VP blend, for example, 60 wt % of 32.5 K/12 K PS-b-P2VP, 20 wt % of 10 K PS, and 20 wt % of 10 K P2VP. Another example of a ternary diblock copolymer blend is a PS-b-PMMA/PS/PMMA blend, for example, 60 wt % of 46K/21K PS-b-PMMA, 20 wt % of 20K polystyrene and 20 wt % of 20K poly(methyl methacrylate). Yet another example is a blend of 60:20:20 (wt %) of PS-b-PEO/PS/PEO, or a blend of about 85-90 wt % PS-b-PEO and up to 10-15 wt % PEO; it is believed that the added PEO homopolymer may function, at least in part, to lower the surface energy of the PEO domains to that of PS.

In the present embodiment, the trench floors 26 are structured to be neutral wetting (equal affinity for both blocks of the copolymer) to induce formation of cylindrical polymer domains that are oriented perpendicular to the trench floors 26, and the trench sidewalls 22 and ends 24 are structured to be preferential wetting by one block of the block copolymer to induce registration of the cylinders to the sidewalls 22 as the polymer blocks self-assemble. In response to the wetting properties of the trench surfaces, upon annealing, the preferred or minority block of the cylindrical-phase block copolymer will self-assemble to form a single row of cylindrical domains in the center of a polymer matrix for the length of the trench and segregate to the sidewalls and edges of the trench to form a thin interface brush or wetting layer (e.g., as in FIGS. 6-6B). Entropic forces drive the wetting of a neutral wetting surface by both blocks, and enthalpic forces drive the wetting of a preferential-wetting surface by the preferred block (e.g., the minority block).

To provide preferential wetting surfaces, for example, in the use of a PS-b-PVP (or PS-b-PMMA, etc.) block copolymer, the material layer 16 can be composed of silicon (with native oxide), oxide (e.g., silicon oxide, $SiO_x$), silicon nitride, silicon oxycarbide, indium tin oxide (ITO), silicon oxynitride, and resist materials such as methacrylate-based resists and polydimethylglutarimide resists, among other materials, which exhibit preferential wetting toward the PVP (or PMMA, etc.) block. In the use of a PS-b-PVP cylinder-phase block copolymer material, for example, the block copolymer material will self-assemble to form a thin interface layer and cylinders of PVP in a PS matrix.

In other embodiments, a preferential wetting material such as a polymethyl methacrylate (PMMA) polymer modified with an —OH containing moiety (e.g., hydroxyethylmethacrylate) can be applied onto the surfaces of the trenches, for example, by spin-coating and then heating (e.g., to about 170° C.) to allow the terminal OH groups to end-graft to oxide sidewalls 22 and ends 24 of the trenches 18. Non-grafted material can be removed by rinsing with an appropriate solvent (e.g., toluene). See, for example, Mansky et al., *Science*, 1997, 275, 1458-1460, and In et al., *Langmuir*, 2006, 22, 7855-7860.

A neutral wetting trench floor 26 allows both blocks of the copolymer material to wet the floor 26 of the trench 18. A neutral wetting material 14 can be provided by applying a neutral wetting polymer (e.g., a neutral wetting random copolymer) onto the substrate 10, forming the material layer 16 and then etching the trenches 18 to expose the underlying neutral wetting material, as illustrated in FIGS. 2-2B.

In another embodiment illustrated in FIGS. 3 and 4, a neutral wetting random copolymer material can be applied after forming the trenches 18', for example, as a blanket coat by casting or spin-coating into the trenches 18', as depicted in FIG. 4. The random copolymer material can then be thermally processed to flow the material into the bottom of the trenches 18' by capillary action, which results in a layer (mat) 14' composed of the crosslinked, neutral wetting random copolymer. In another embodiment, the random copolymer material within the trenches 18' can be photo-exposed (e.g., through a mask or reticle) to crosslink the random copolymer within the trenches 18' to form the neutral wetting material 14'. Non-crosslinked random copolymer material outside the trenches (e.g., on the spacers 20') can be subsequently removed.

Neutral wetting surfaces can be specifically prepared by the application of random copolymers composed of monomers identical to those in the block copolymer and tailored such that the mole fraction of each monomer is appropriate to form a neutral wetting surface. For example, in the use of a PS-b-PVP block copolymer, a neutral wetting material 14 can be formed from a thin film of a photo-crosslinkable random PS-r-PVP that exhibits non-preferential or neutral wetting toward PS and PVP, which can be cast onto the substrate 10 (e.g., by spin-coating). The random copolymer material can be fixed in place by chemical grafting (on an oxide substrate) or by thermally or photolytically crosslinking (any surface) to form a mat that is neutral wetting to PS and PVP and insoluble when the block copolymer material is cast onto it, due to the crosslinking. In another example, in the use of PS-b-PMMA, a photo-crosslinkable PS-r-PMMA random copolymer (e.g., containing an about 0.6 mole fraction of styrene) can be used.

In embodiments in which the substrate 10 is silicon (with native oxide), another neutral wetting surface for PS-b-PMMA can be provided by hydrogen-terminated silicon. The floors 26 of the trenches 18 can be etched, for example, with a hydrogen plasma, to remove the oxide material and form hydrogen-terminated silicon, which is neutral wetting with equal affinity for both blocks of a block copolymer material. H-terminated silicon can be prepared by a conventional process, for example, by a fluoride ion etch of a silicon substrate (with native oxide present, about 12-15 Å) by exposure to an aqueous solution of hydrogen fluoride (HF) and buffered HF or ammonium fluoride ($NH_4F$), by HF vapor treatment, or by a hydrogen plasma treatment (e.g., atomic hydrogen).

An H-terminated silicon substrate can be further processed by grafting a random copolymer such as PS-r-PVP, PS-r-PMMA, etc. selectively onto the substrate resulting in a neutral wetting surface for the corresponding block copolymer (e.g., PS-b-PVP, PS-b-PMMA, etc.). For example, a neutral wetting layer of a PS-r-PMMA random copolymer can be provided by an in situ free radical polymerization of styrene and methyl methacrylate using a di-olefinic linker such as divinyl benzene, which links the polymer to the surface to produce about a 10-15 nm thick film.

Referring again to FIGS. 3 and 4, in another embodiment, a neutral wetting random copolymer material 14' can be applied after formation of the material layer 16' and trenches 18', which reacts selectively with the trench floor 26' (composed of the substrate 10' material) and not the trench sidewalls 22' or ends 24' (composed of the material layer 16'). For example, a random copolymer (or appropriate blend of homopolymers with block copolymer surfactant) containing epoxide groups will react selectively to terminal amine functional groups (e.g. —NH— and —$NH_2$) on silicon nitride and silicon oxynitride surfaces relative to silicon oxide or silicon. In another example in which the trench floor 26' is silicon or polysilicon and the sidewalls 22' are a material such as an oxide (e.g., $SiO_x$), the trench floor 26' can be treated to form H-terminated silicon and a random copolymer material 14' (e.g., PS-r-PVP, PS-r-PMMA, etc.) can be formed in situ only at the floor surface.

In another embodiment, a neutral wetting surface (e.g., for PS-b-PMMA and PS-b-PEO) can be provided by grafting a self-assembled monolayer (SAM) of a trichlorosilane-base SAM such as 3-(para-methoxyphenyl)propyltrichorosilane grafted to oxide (e.g., $SiO_2$) as described, for example, by D. H. Park, *Nanotechnology* 18 (2007), p. 355304.

In a further embodiment, a neutral wetting random copolymer of polystyrene (PS), polymethacrylate (PMMA) with hydroxyl group(s) (e.g., 2-hydroxyethyl methacrylate (P(S-r-MMA-r-HEMA)) (e.g., about 58 wt % PS) can be can be selectively grafted to a substrate 10 (e.g., an oxide) as a neutral wetting layer 14 about 5-10 nm thick by heating at about 160° C. for about 48 hours. See, for example, In et al., *Langmuir*, 2006, 22, 7855-7860.

In yet another embodiment, a blend of hydroxyl-terminated homopolymers and a corresponding low molecular weight block copolymer can be grafted (covalently bonded) to the substrate to form a neutral wetting interface layer (e.g., about 4-5 nm) for PS-b-PMMA and PS-b-P2VP, among other block copolymers. The block copolymer can function to emulsify the homopolymer blend before grafting. For example, an about 1 wt % solution (e.g., in toluene) of a blend of about 20-50 wt % (or about 30-40 wt %) OH-terminated homopolymers (e.g., $M_n$=6K) and about 80-50 wt % (or about 70-60 wt %) of a low molecular weight block copolymer (e.g., 5K-5K) can be spin-coated onto a substrate 10 (e.g., $SiO_2$), heated (baked) (e.g., at 160° C.), and non-grafted (unbonded) polymer material removed, for example, by a solvent rinse (e.g., toluene). For example, the neutral wetting material can be prepared from a blend of about 30 wt % PS-OH ($M_n$=6K) and PMMA-OH ($M_n$=6K) (weight ratio of 4:6) and about 70 wt % PS-b-PMMA (5K-5K), or a ternary blend of PS-OH (6K), P2VP-OH (6K) and PS-b-2PVP (8K-8K), etc.

A surface that is neutral wetting to PS-b-PMMA can also be prepared by spin-coating a blanket layer of a photo- or thermally cross-linkable random copolymer such as a benzocyclobutene- or azidomethylstyrene-functionalized random copolymer of styrene and methyl methacrylate (e.g., poly (styrene-r-benzocyclobutene-r-methyl methacrylate (PS-r-PMMA-r-BCB)). For example, such a random copolymer can comprise about 42 wt % PMMA, about (58-x) wt % PS and x wt % (e.g., about 2-3 wt %) of either polybenzocyclobutene or poly(para-azidomethylstyrene)). An azidomethylstyrene-functionalized random copolymer can be UV photo-crosslinked (e.g., 1-5 $MW/cm^2$ exposure for about 15 seconds to about 30 minutes) or thermally crosslinked (e.g., at about 170° C. for about 4 hours) to form a crosslinked polymer mat as a neutral wetting layer 14. A benzocyclobutene-functionalized random copolymer can be thermally crosslinked (e.g., at about 200° C. for about 4 hours or at about 250° C. for about 10 minutes).

As illustrated in FIGS. 5-5B, a self-assembling, cylindrical-phase block copolymer material 28 having an inherent pitch at or about $L_o$ (or a ternary blend of block copolymer and homopolymers blended to have a pitch at or about $L_B$) can be cast or deposited into the trenches 18 to a thickness ($t_1$) at or about the L value of the block copolymer material 28 (e.g., about ±20% of L) such that after annealing (e.g., FIG. 6A), the thickness ($t_2$) will be at or about the L value and the block copolymer material 28 will self-assemble to form a single layer of cylinders having a diameter of about 0.5*L (e.g., 5-50 nm, or about 20 nm, for example) within a polymer matrix in a single row within each trench 18. The thickness of the block copolymer material 28 can be measured, for example, by ellipsometry techniques.

The block copolymer material 28 can be deposited by spin-casting (spin-coating) from a dilute solution (e.g., about 0.25-2 wt % solution) of the copolymer in an organic solvent such as dichloroethane ($CH_2Cl_2$) or toluene, for example. Capillary forces pull excess block copolymer material 28 (e.g., greater than a monolayer) into the trenches 18. As shown, a thin layer or film 28a of the block copolymer material 28 can be deposited onto the material layer 16 outside the trenches 18, e.g., on the spacers 20. Upon annealing, the thin film 28a will flow into the trenches 18 leaving a structureless brush layer on the material layer 16 from a top-down perspective.

Figure 6:
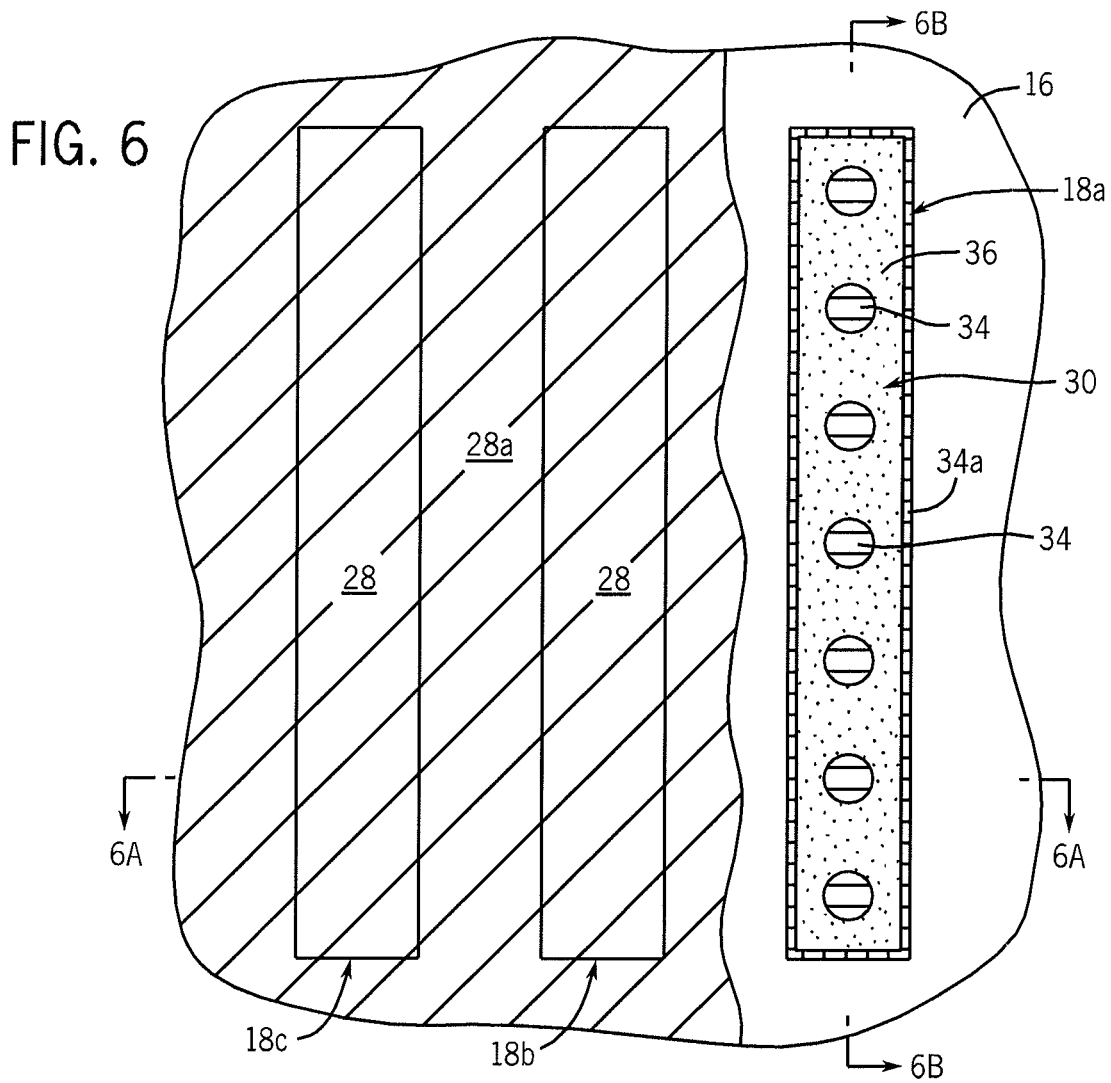
FIGS. 6-8 are diagrammatic top plan views of the substrate of FIG. 5 at subsequent stages showing annealing of a portion of the film according to an embodiment of the invention by a zoned annealing technique.
Figure 6A:
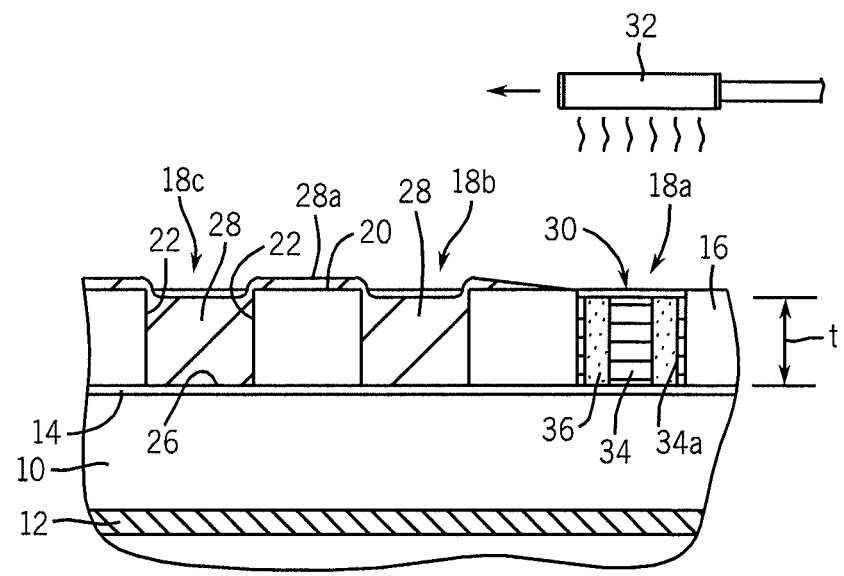
Figure 6B:
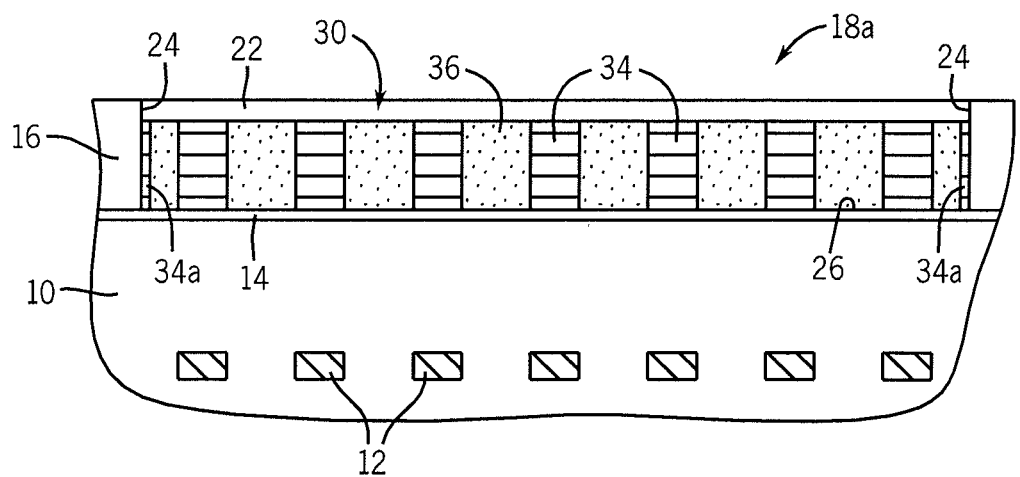
FIG. 6B is an elevational, cross-sectional view of the substrate depicted in FIG. 6 taken along lines 6B-6B.

The block copolymer (BCP) material 28 is then heated above its glass transition temperature under a vapor phase containing a partly saturated concentration of an organic solvent to cause the polymer blocks to phase separate and self-assemble according to the preferential and neutral wetting of the trench surfaces to form a self-assembled polymer material 30, as illustrated in FIGS. 6-6B. The appropriate partial pressure of solvent vapor to achieve a neutral wetting vapor interface at a particular temperature depends, at least in part, on the block copolymer that is used and can be determined empirically.

The block copolymer is heated at a thermal anneal temperature that is above its glass transition temperature ($T_g$) but below the decomposition or degradation temperature ($T_d$) of the block copolymer material. For example, a PS-b-PVP block copolymer material can be annealed at a temperature of about 150° C.-275° C. in a solvent vapor atmosphere for about 1-24 hours to achieve a self-assembled morphology. A PS-b-PMMA block copolymer material can be annealed at a temperature of about 150° C.-275° C. in a solvent vapor atmosphere for about 1-24 hours to achieve a self-assembled morphology.

In most applications of a thermal anneal in a vacuum, an air interface is preferentially wetting to one of the polymer domains and the BCP material does not orient into perpendicular structures. In embodiments of the invention, during heating, the BCP material 28 is exposed to solvent vapors of a "good" solvent for both blocks, that is, a neutral organic solvent that solvates both the constituent blocks well.

In general, solvent annealing consists of two phases. In a first phase, the BCP material is exposed to a solvent vapor that acts to plasticize the film and increase chain mobility causing the domains to intermingle and the loss of order inherent from casting the polymer material. The organic solvent that is utilized is based at least in part on its solubility in the block copolymer material such that sufficient solvent molecules enter the block copolymer material to promote the order-disorder transition of the polymer domains and enable the required molecular rearrangement. Examples of solvents include aromatic solvents such as benzene, toluene, xylene, dimethoxyethane, ethyl acetate, cyclohexanone, etc., and chlorinated solvents such as chloroform, methylene chloride, a chloroform/octane mixture, etc., among others. In a second phase, the substrate is removed from the solvent vapor and the solvent and solvent vapors are allowed to diffuse out of the polymer material and evaporate. The block copolymer material begins to "dry" as the solvent evaporates from the material. The evaporation of the solvent is highly directional and forms a solvent gradient from the "top" (surface) of the BCP material to the "bottom" of the BCP material at the trench floor that induces orientation and self-assembly of structures starting at the air-surface interface, which is neutral wetting due to the partial pressure of solvent at the interface, and driven downward to the floor of the trench, with formation of perpendicular-oriented cylindrical domains 34 guided by the trench sidewalls and extending completely from the air interface to the substrate surface (trench floor).

In embodiments of the invention, the substrate 10 and BCP material 28 are heated above the boiling point of the solvent such that swelling of the BCP material 28 by the solvent is disallowed.

The use of a partly-saturated solvent vapor phase above the block copolymer material 28 provides a neutral wetting interface, similar to the second phase of solvent annealing. The concentration of solvent in the air immediate at the vapor interface with the BCP material 28 is maintained at or under saturation to maintain a neutral wetting interface such that both (or all) polymer blocks will equally wet the vapor interface. As both the air and trench floor 26 are neutral wetting, the domains will orient perpendicular throughout the film layer, with the preferential wetting sidewalls inducing lateral order.

The resulting morphology of the annealed copolymer material 30 (e.g., perpendicular orientation of cylinders 34) can be examined, for example, using atomic force microscopy (AFM), transmission electron microscopy (TEM), scanning electron microscopy (SEM), among others.

In embodiments of the invention, the anneal is performed by globally heating the block copolymer within the trenches in a solvent atmosphere.

In other embodiments, a zone annealing is conducted to anneal portions or sections of the block copolymer material 28 in trenches on the substrate 10 by a localized application of thermal energy (e.g., heat). Zone annealing can provide rapid self-assembly of the block copolymer material (e.g., on the order of minutes).

Figure 7:
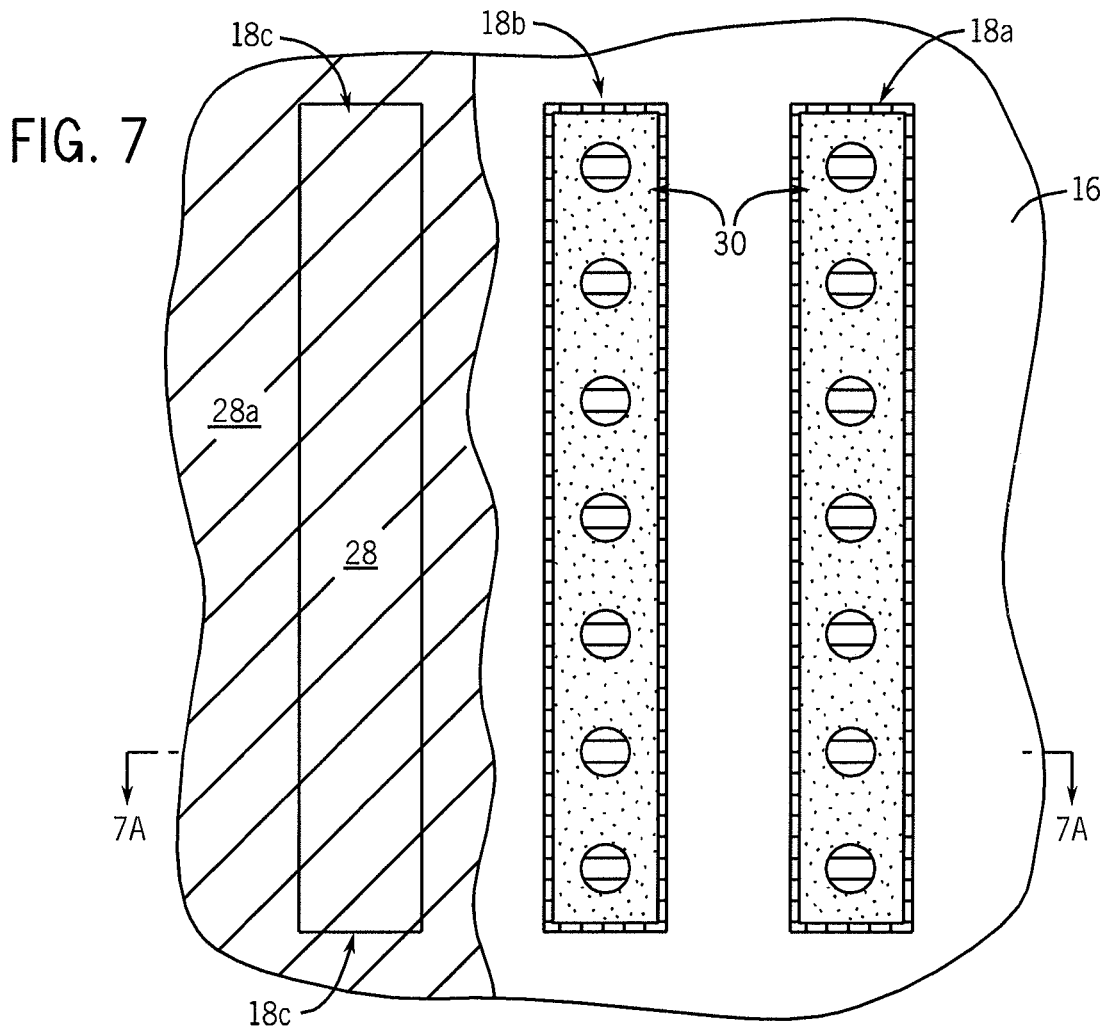
Figure 8:
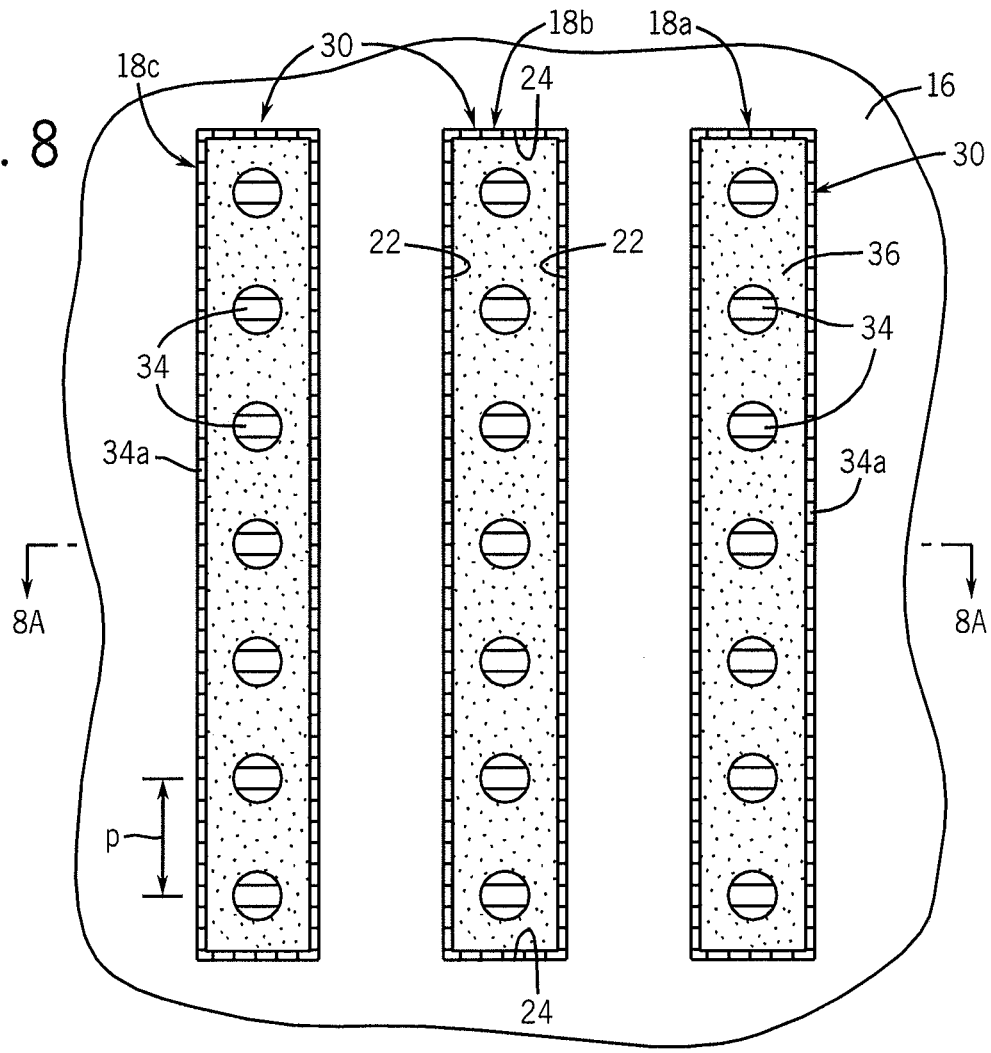

For example, as depicted sequentially in FIGS. 6-8, the substrate 10 (in a vapor atmosphere) and a thermal or heat source 32 (or combined heating and cooling source) can be moved relative to each other (e.g., arrow ←) such that heat is applied above (or underneath) the substrate 10. Only a portion of the BCP material 28 is initially heated above the glass transition temperature and the heated zone is then "pulled" across the substrate 10 (or vice versa). For example, the thermal or heat source 32 can be moved across the substrate 10 at a translational set speed (e.g., about 0.05-10 μm/second using a mechanism such as a motorized translation stage (not shown). Pulling the heated zone across the substrate 10 (or vice versa) can result in faster processing and better ordered structures relative to a global thermal anneal.

In some embodiments, a hot-to-cold temperature gradient can be provided over (or under) the substrate such that a certain portion of the substrate is heated and then cooled, which can be at a controlled rate. In other embodiments, the substrate can be exposed to a cold-to-hot temperature gradient to anneal the BCP material, followed by cooling.

In other embodiments, the BCP material can be heated above and then cooled below the order-disorder temperature (but above the glass transition temperature), for example, to remove (melt out) defects and allow the material to recrystallize provided that the order-disorder temperature ($T_{o-d}$) is less than the decomposition temperature ($T_d$) of the block copolymer material. The order-disorder temperature is defined by the temperature dependence of the block copolymer, Chi value, the total number of monomers per chain, and the monomer composition.

Figure 7A:
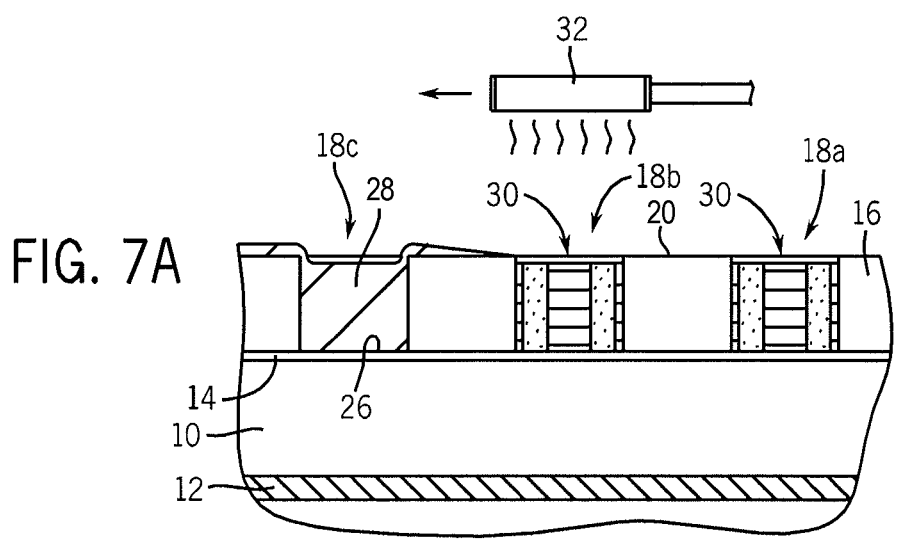
Figure 8A:
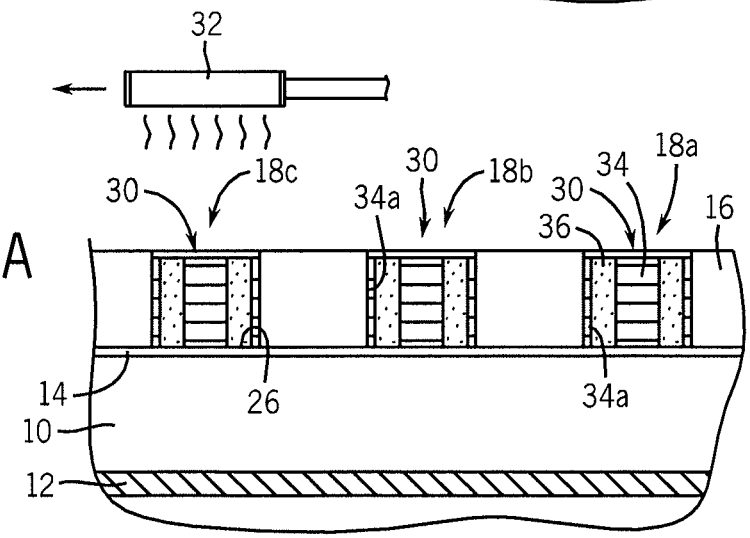

Only those portions of the block copolymer material that are heated above the glass transition temperature ($T_g$) of the component polymer blocks will self-assemble, and areas of the material that were not sufficiently heated remain disordered and unassembled. For example, as illustrated in FIGS. 6-6B, initially, the block copolymer material 28 within trench 18a can be heated and annealed to form a self-assembled material 30 while the unannealed block copolymer material 28 within trenches 18b, 18c remains disordered. Only those portions of the block copolymer material 28 that are heated above the glass transition temperature ($T_g$) will self-assemble. A next portion of the substrate 10 can then be selectively heated, as shown in FIGS. 7 and 7A, resulting in the self-assembly of the block copolymer material within trench 18b. A subsequent heating of the remaining areas of the substrate 10 can then be conducted, e.g., as depicted in FIGS. 8 and 8A.

Upon annealing, the cylindrical-phase block copolymer material 28 will self-assemble into a polymer material 30 (e.g., film) in response to the character of the block copolymer composition (e.g., PS-b-PVP having an inherent pitch at or about L) and the boundary conditions, including the constraints provided by the width ($w_t$) of the trench 18 and the wetting properties of the trench surfaces including a trench floor 26 that exhibits neutral or non-preferential wetting toward both polymer blocks (e.g., a random graft copolymer), sidewalls 22 that are preferential wetting by the minority (preferred) block of the block copolymer (e.g., the PVP block), and the presence of a neutral or non-preferential solvent (or in some embodiments, a film or material that is neutral or non-preferential wetting) in contact with the surface of the block copolymer material 28 in the trenches 18. The anneal results in a row (or rows) of perpendicularly oriented cylinders 34 of the minority polymer (preferred) block (e.g., PVP) within a matrix 36 of the majority polymer block (e.g., PS), with the cylinders 34 registered and parallel to the sidewalls 22 of the trenches 18. The diameter of the cylinders 34 will generally be at or about 0.5*L (e.g., about one-half of the center-to-center distance between cylinders). In addition, the minority (preferred) block (e.g., PVP) will segregate to and wet the preferential wetting sidewalls 22 and ends 24 of the trenches 18 to form a thin interface or wetting brush layer 34a having a thickness generally about one-fourth of the center-to-center distance between adjacent cylinders 34. For example, a layer of the PVP block will wet oxide interfaces with attached PS domains directed outward from the oxide material.

In some embodiments, the self-assembled block copolymer material 30 is defined by a single layer of an array of cylindrical domains (cylinders) 34, each with a diameter at or about 0.5*L (e.g., about one-half of the center-to-center distance between cylinders), with the number (n) of cylinders in the row according to the length ($l_t$) of the trench, and the center-to-center distance (pitch distance, p) between each cylinder at or about L.

Optionally, after the block copolymer material is annealed and ordered, the copolymer material can be treated to crosslink the polymer segments (e.g., the PS segments) to fix and enhance the strength of the self-assembled polymer blocks. The polymers can be structured to inherently crosslink (e.g., upon exposure to ultraviolet (UV) radiation, including deep ultraviolet (DUV) radiation), or one of the polymer blocks of the copolymer material can be formulated to contain a crosslinking agent.

Generally, the film 28a outside the trenches 18a, 18b, 18c (e.g., on spacers 20) will not be thick enough to result in self-assembly. Optionally, the unstructured thin film 28a can be removed, as illustrated in FIGS. 8 and 8A, for example, by an etch technique or a planarization process to provide an about uniformly flat surface. For example, the trench regions can be selectively exposed through a reticle (not shown) to crosslink only the annealed and self-assembled polymer material 30 within the trenches 18a, 18b, 18c, and a wash can then be applied with an appropriate solvent (e.g., toluene) to remove the non-crosslinked portions of the block copolymer material 28 (e.g., on the spacers 20), leaving the registered self-assembled polymer material 30 within the trenches 18a, 18b, 18c and exposing the surface of the material layer 16 above/outside the trenches 18a, 18b, and 18c. In another embodiment, the annealed polymer material 30 can be crosslinked globally, a photoresist material can be applied to pattern and expose the areas of the polymer material 28a outside the trench regions, and the exposed portions of the polymer material 28a can be removed, for example, by an oxygen ($O_2$) plasma treatment.

Figure 9B:
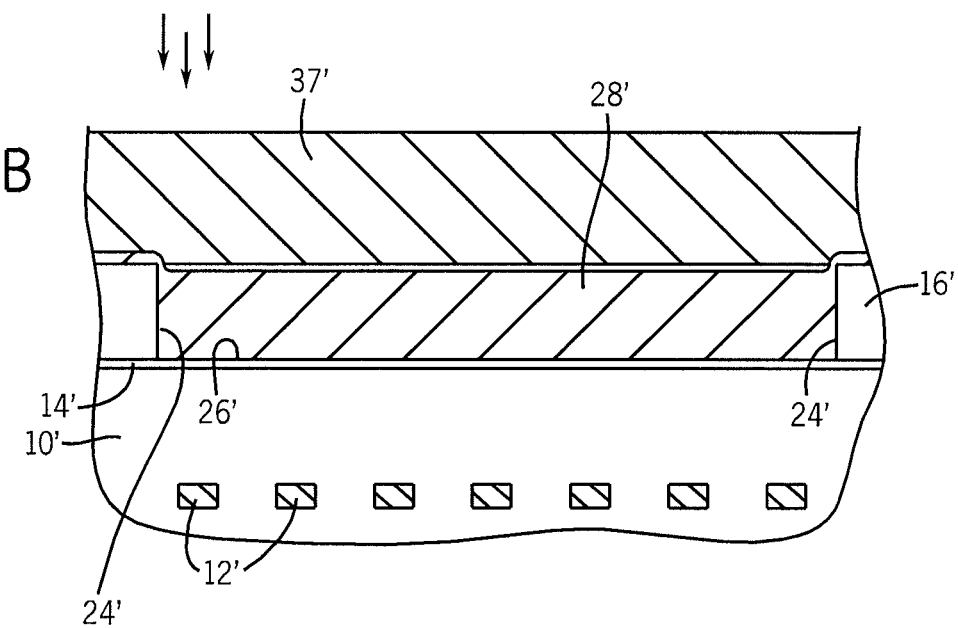

Referring to FIG. 9, in another embodiment of a method of the invention, a thermal anneal is conducted while applying a non-preferentially wetting material 37' to the surface of the block copolymer (BCP) material 28' in the trenches. In some embodiments, the non-preferentially wetting material 37' is composed of a solid material, which can be physically placed onto the BCP material 28', for example, a soft, flexible or rubbery solid material such as a cross-linked, poly(dimethylsiloxane) (PDMS) elastomer (e.g., SYLGARD® 184 by Dow-Corning) or other elastomeric polymer material (e.g., silicones, polyurethanes, etc.), which provides an external surface that is neutral wetting. The solid material can be derivatized (e.g., by grafting a random copolymer) such that it presents a neutral wetting surface.

Figure 10A:
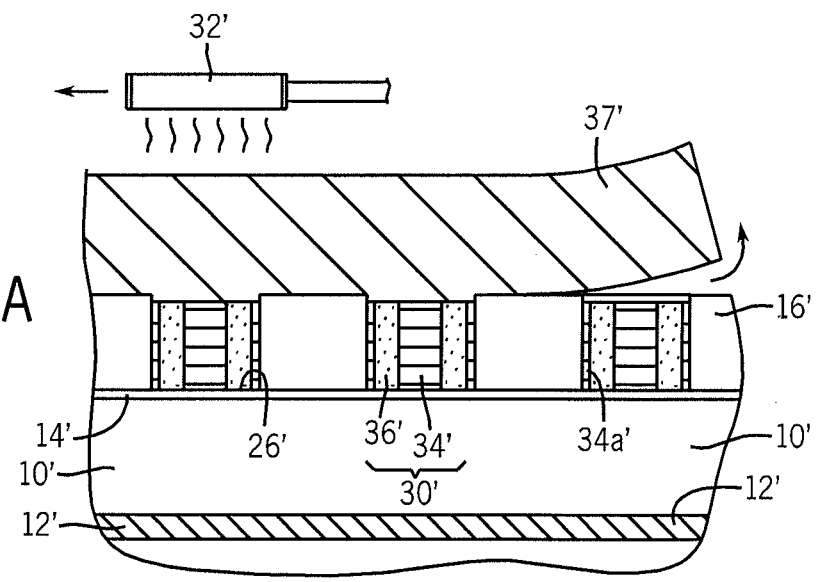
FIGS. 10A and 10B are cross-sectional views of the substrate shown in FIGS. 9A and 9B, respectively, at a subsequent stage showing the annealed, self-assembled block copolymer material, and removal of the non-preferential wetting material after the anneal.
Figure 10B:
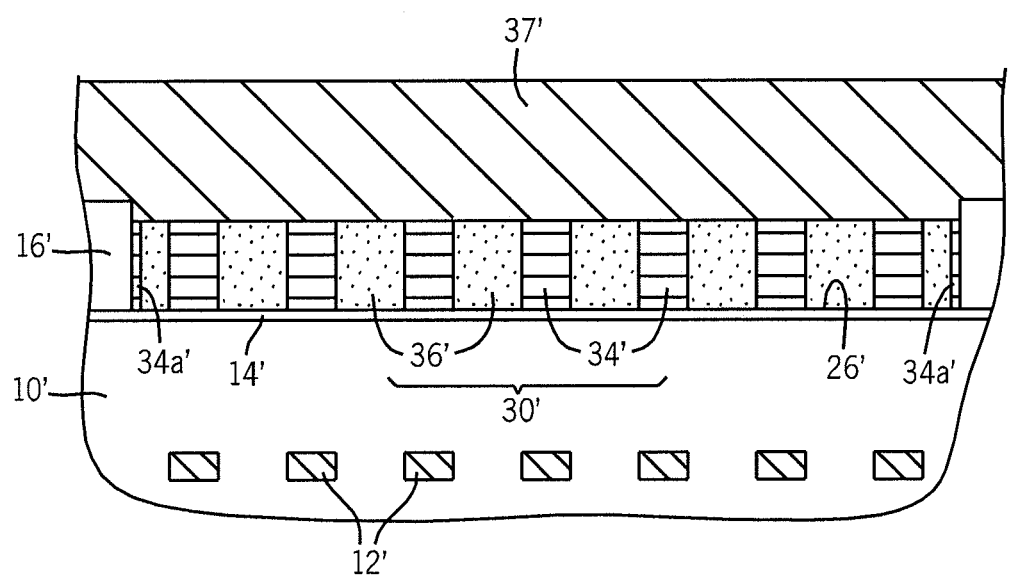

With the non-preferentially wetting material 37' in contact with the surface of the block copolymer material 28', a thermal annealing process is conducted (arrows ↓, FIGS. 9A and 9B) to cause the polymer blocks to phase separate in response to the preferential and neutral wetting of the trench surfaces and the non-preferential (neutral) wetting of the overlying material 37', and form a self-assembled polymer material 30' as illustrated in FIGS. 10A and 10B.

After annealing, the non-preferentially wetting material 37' can be removed from contact with the annealed polymer material 30' (arrow ↑) as depicted in FIG. 10A. A PDMS or other elastomeric material layer 37' can be removed, for example, by lifting or peeling the material from the surface of the annealed copolymer material 30'. Additionally, a solvent such as water, alcohols, and the like, which is compatible with and does not dissolve the block copolymer material 30', can be applied (e.g., by soaking) to permeate and swell the elastomeric material (e.g., PDMS) to enhance physical removal. A dilute fluoride solution (e.g., $NH_4F$, HF, NaF, etc.) can also be applied to etch and dissolve a PDMS material to remove it from the annealed polymer material.

Following self-assembly, the pattern of perpendicular-oriented cylinders 34' that is formed on the substrate 10' can then be further processed as desired, for example, to form an etch mask for patterning nanosized features into the underlying substrate 10' through selective removal of one block of the self-assembled block copolymer. Since the domain sizes and periods (L) involved in this method are determined by the chain length of a block copolymer (MW), resolution can exceed other techniques such as conventional photolithography. Processing costs using the technique is significantly less than extreme ultraviolet (EUV) photolithography, which has comparable resolution.

Figure 12A:
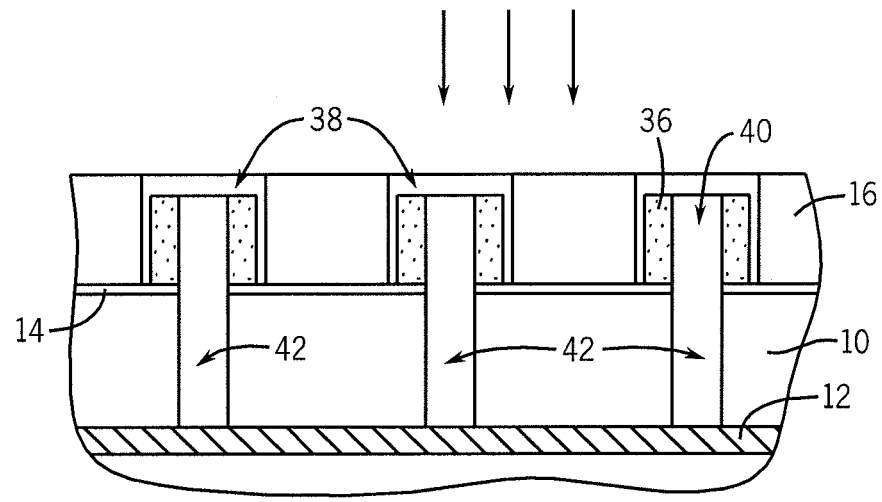
Figure 12B:
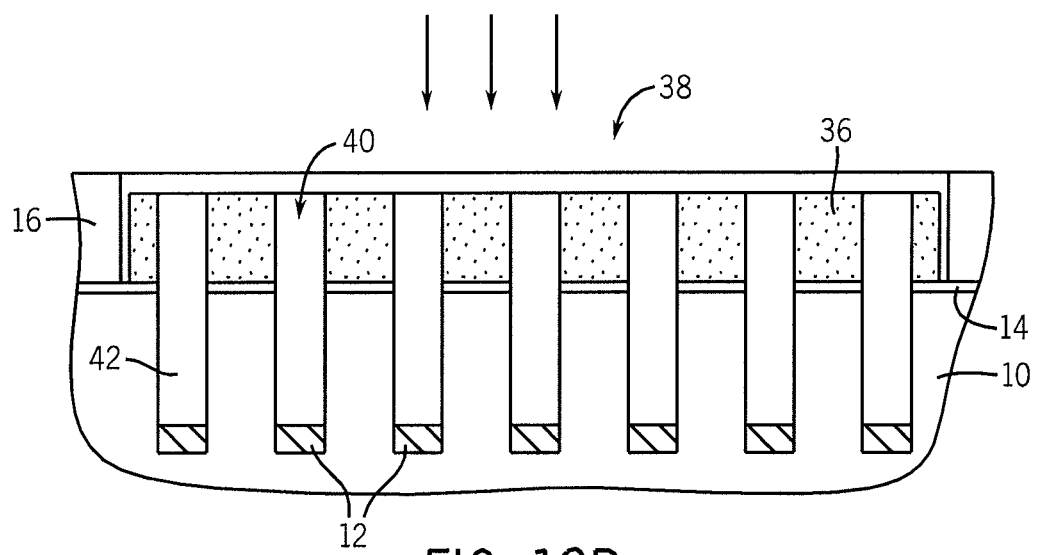

For example, as illustrated in FIGS. 11-11B, in one embodiment, an etch mask 38 can be formed by selectively removing the cylindrical polymer domains 34 of the self-assembled polymer material 30 to produce openings 40 in the polymer matrix 36 (e.g., PS) to expose the underlying substrate 10 at the trench floors 26. For example, the cylindrical domains 34 can be removed by a selective wet etch (e.g., PMMA and PLA by UV exposure/acetic acid development, PLA by aqueous methanol mixture containing sodium hydroxide, PEO by aqueous hydroiodic acid or water, etc.) or by a selective reactive ion etch (RIE) process. In embodiments in which the block copolymer includes a cleavable linker group, the film can be exposed to a solvent selective to the minor domain, for example, an alcohol for PVP, water for PEO or PLA, and acetic acid for PMMA, that contains a cleaving agent to remove (e.g., wash out) the minor domain. As depicted in FIGS. 12-12B, the remaining porous polymer (e.g., PS) matrix 36 can then be used as a lithographic template or mask to etch (arrows ↓↓) a series of cylindrical-shaped openings or contact holes 42 in the nanometer size range (e.g., about 10-100 nm) to the conductive lines 12 or other active area (e.g., semiconducting region, etc.) in the underlying substrate 10 (or an underlayer). The openings 42 can be formed, for example, using a selective reactive ion etching (RIE) process.

Figure 13:
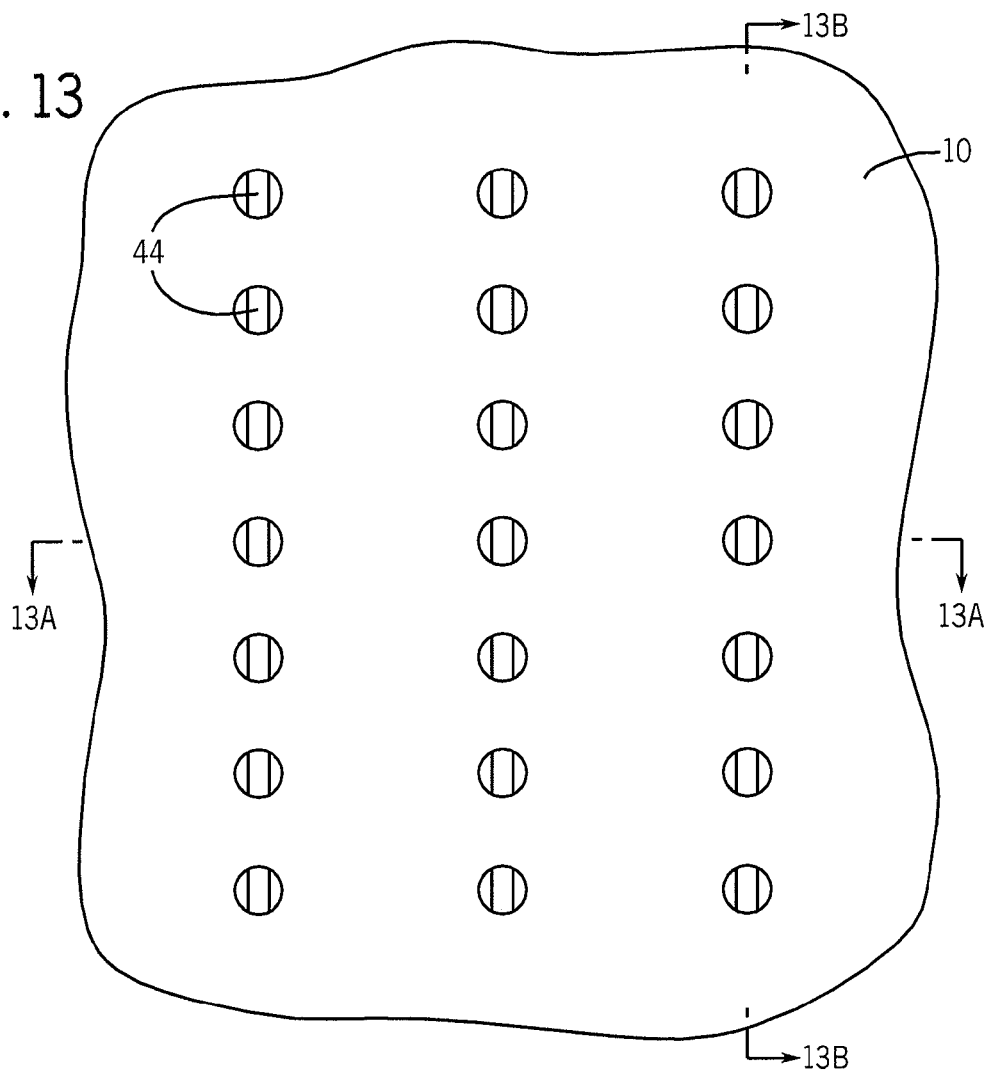
Figure 13A:
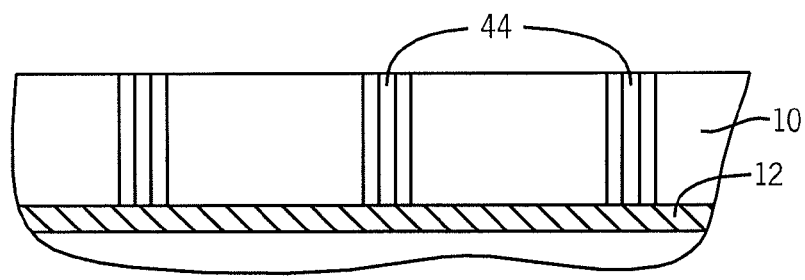
Figure 13B:
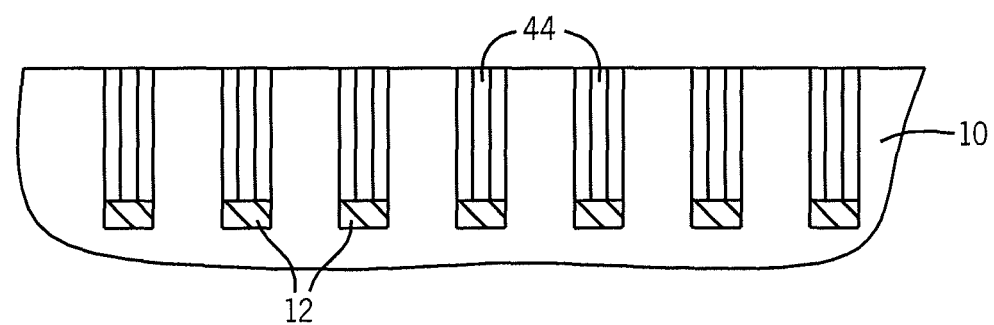

Further processing can then be performed as desired. For example, as depicted in FIGS. 13-13B, the residual polymer matrix 36 can be removed (e.g., PS by an oxidation process such as a plasma $O_2$ etch) and the openings 42 of substrate 10 can be filled with a material 44 such as a metal or metal alloy such as Cu, Al, W, Si, and $Ti_3N_4$, among others, to form arrays of cylindrical contacts to the conductive lines 12. The cylindrical openings 42 in the substrate 10 can also be filled with a metal-insulator-metal stack to form capacitors with an insulating material such as $SiO_2$, $Al_2O_3$, $HfO_2$, $ZrO_2$, $SrTiO_3$, and the like.

Embodiments of the invention utilize a thermal anneal process in combination with solvent annealing, which can provide faster processing than with a solvent anneal alone and expands the types of block copolymers (BCPs) that can be processed to substantially all BCPs. In embodiments using a zone annealing in combination with an organic solvent atmosphere, a wide range of block copolymers can be processed to form perpendicular-oriented nanostructures (e.g., cylinders) and at a rapid rate.

In addition, methods of the disclosure provide a means of generating self-assembled diblock copolymer films composed of perpendicular-oriented cylinders in a polymer matrix. The methods provide ordered and registered elements on a nanometer scale that can be prepared more inexpensively than by electron beam lithography, EUV photolithography or conventional photolithography. The feature sizes produced and accessible by this invention cannot be easily prepared by conventional photolithography. The described methods and systems can be readily employed and incorporated into existing semiconductor manufacturing process flows and provide a low cost, high-throughput technique for fabricating small structures.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of forming a nanostructured polymer material, comprising:
    heating a substrate and a block copolymer material on the substrate to a temperature above a boiling point of an organic solvent to minimize swelling of the block copolymer material; and
    thermally annealing the block copolymer material in a vapor of the organic solvent and at a temperature above the glass transition temperature ($T_g$) of the block copolymer material to cause polymer blocks of the block copolymer material to phase separate and self-assemble within a trench.

2. The method of claim 1, wherein thermally annealing a block copolymer material in a vapor of an organic solvent and at a temperature above the glass transition temperature ($T_g$) of the block copolymer material comprises:
    heating a first section of the block copolymer material to cause the first section to phase separate and self-assemble, and then subsequently heating remaining sections of the block copolymer material to cause the remaining sections to phase separate and self-assemble.

3. The method of claim 1, wherein the trench comprises a neutral wetting floor and preferentially wetting sidewalls and ends.

4. The method of claim 3, wherein the preferentially wetting sidewalls and ends of the trench comprises a material selected from the group consisting of silicon with native oxide, oxide, silicon nitride, silicon oxycarbide, indium tin oxide (ITO), silicon oxynitride, methacrylate resist, and polydimethylglutarimide resist.

5. The method of claim 3, wherein the neutral wetting floor of the trench comprises a material selected from the group consisting of a random copolymer material, a blend of grafted homopolymers, and hydrogen-terminated silicon.

6. The method of claim 1, wherein thermally annealing a block copolymer material in a vapor of an organic solvent and at a temperature above the glass transition temperature ($T_g$) of the block copolymer material comprises:
annealing the block copolymer material in a solvent vapor that is non-preferential to any polymer block.

7. The method of claim 1, wherein thermally annealing a block copolymer material in a vapor of an organic solvent and at a temperature above the glass transition temperature ($T_g$) of the block copolymer material comprises:
annealing the block copolymer material in a partly saturated concentration of the organic solvent.

8. The method of claim 1, wherein the block copolymer material comprises a cylindrical-phase block copolymer.

9. The method of claim 8, wherein thermally annealing a block copolymer material in a vapor of an organic solvent and at a temperature above the glass transition temperature ($T_g$) of the block copolymer material comprises:
self-assembling the block copolymer material into cylinders of a first block within a matrix of a second block of the block copolymer material, the cylinders oriented perpendicular to and extending from a floor of the trench to an interface of the block copolymer material with the vapor of the organic solvent.

10. The method of claim 1, wherein thermally annealing a block copolymer material in a vapor of an organic solvent and at a temperature above the glass transition temperature ($T_g$) of the block copolymer material comprises:
zone heating the block copolymer material in the vapor of the organic solvent to cause polymer blocks of the block copolymer material to phase separate and self-assemble within the trench.

11. The method of claim 1, wherein thermally annealing a block copolymer material in a vapor of an organic solvent and at a temperature above the glass transition temperature ($T_g$) of the block copolymer material comprises:
zone heating a first section and then subsequent sections of the block copolymer material in the vapor of the organic solvent to cause the copolymer material phase to separate and self-assemble in the first section and then in the subsequent sections.

12. The method of claim 1, wherein thermally annealing a block copolymer material in a vapor of an organic solvent and at a temperature above the glass transition temperature ($T_g$) of the block copolymer material comprises maintaining a concentration of the organic solvent in the air at a vapor interface with the block copolymer material at or under saturation.

13. The method of claim 1, wherein thermally annealing a block copolymer material in a vapor of an organic solvent and at a temperature above the glass transition temperature ($T_g$) of the block copolymer material comprises globally heating the block copolymer material.

14. The method of claim 1, wherein thermally annealing a block copolymer material in a vapor of an organic solvent and at a temperature above the glass transition temperature ($T_g$) of the block copolymer material comprises:
heating the block copolymer material above an order-disorder temperature of the block copolymer material; and
cooling the heated block copolymer material to below the order-disorder temperature but above the glass transition temperature of the block copolymer material.

15. The method of claim 1, wherein the block copolymer material comprises a polymer selected from the group consisting of poly(styrene)-b-poly(vinylpyridine), poly(styrene)-b-poly(methyl methacrylate), poly(styrene)-b-polyacrylate, poly(styrene)-b-poly(methacrylate), poly(styrene)-b-poly(lactide), poly(styrene)-b-poly(tert-butyl acrylate), poly(styrene)-b-poly(ethylene-co-butylene), poly(styrene)-b-poly(ethylene oxide), poly(isoprene)-b-poly(ethyleneoxide), poly(isoprene)-b-poly(methyl methacrylate), poly(butadiene)-b-poly(ethyleneoxide), poly(styrene)-b-poly(ethylene oxide) copolymer having a cleavable junction between poly(styrene) and poly(ethylene oxide) blocks, poly(styrene)-b-poly(methyl methacrylate) doped with poly(ethylene oxide)-coated gold nanoparticles, poly(styrene)-b-poly(2-vinylpyridine) copolymer having a cleavable junction, poly(styrene)-b-poly(methyl methacrylate)-b-poly(ethylene oxide), poly(styrene)-b-poly(methyl methacrylate)-b-poly(styrene), poly(methyl methacrylate)-b-poly(styrene)-b-poly(methyl methacrylate), poly(styrene)-b-poly(isoprene)-b-poly(styrene), and combinations thereof.

16. A method of forming a nanostructured material, comprising:
forming a block copolymer material within a trench in a material layer overlying a substrate;
heating the substrate and the block copolymer material to a temperature above a boiling point of an organic solvent;
thermally annealing the block copolymer material in a vapor of the organic solvent and at a temperature above the glass transition temperature ($T_g$) of the block copolymer material to cause polymer blocks of the block copolymer material to phase separate and self-assemble;
selectively crosslinking a first block of the self-assembled block copolymer material;
selectively removing a second block of the self-assembled block copolymer material to form openings extending through the self-assembled block copolymer material; and
removing at least a portion of the substrate through the openings.

17. The method of claim 16, wherein thermally annealing a block copolymer material in a vapor of an organic solvent and at a temperature above the glass transition temperature ($T_g$) of the block copolymer material comprises exposing the substrate to a temperature gradient, followed by cooling.

18. The method of claim 16, wherein thermally annealing a block copolymer material in a vapor of an organic solvent and at a temperature above the glass transition temperature ($T_g$) of the block copolymer material comprises:
self-assembling the block copolymer material into at least one row of perpendicular-oriented cylinders of the second block within a matrix of the first block of the block copolymer material, with the perpendicular-oriented cylinders registered and parallel to sidewalls of the trench.

19. The method of claim 16, wherein thermally annealing a block copolymer material in a vapor of an organic solvent and at a temperature above the glass transition temperature ($T_g$) of the block copolymer material comprises self-assembling the block copolymer material into cylindrical domains of the second block within a matrix of the first block of the block copolymer material, and wherein selectively removing the second block of the self-assembled block copolymer material comprises removing the cylindrical domains of the second block to form openings extending through the self-assembled block copolymer material.

20. The method of claim 16, further comprising, after removing at least a portion of the substrate through the openings,
   removing the crosslinked first block of the self-assembled block copolymer material, and filling the openings with a fill material.

21. The method of claim 20, wherein filling the openings with a fill material comprises filling the openings with a material selected from the group consisting of a metal, a metal alloy, and a metal-insulator-metal stack.

* * * * *

UNITED STATES PATENT AND TRADEMARK OFFICE
CERTIFICATE OF CORRECTION

| | |
|---|---|
| PATENT NO. | : 9,315,609 B2 |
| APPLICATION NO. | : 14/104304 |
| DATED | : April 19, 2016 |
| INVENTOR(S) | : Dan B. Millward and Timothy A. Quick |

It is certified that error appears in the above-identified patent and that said Letters Patent is hereby corrected as shown below:

In the specification:

COLUMN 4, LINE 10, change "can be fainted in" to --can be formed in--

Signed and Sealed this
Second Day of August, 2016

Michelle K. Lee
*Director of the United States Patent and Trademark Office*